(12) United States Patent
Park

(10) Patent No.: US 9,779,941 B2
(45) Date of Patent: Oct. 3, 2017

(54) METHODS OF FORMING PATTERNS OF SEMICONDUCTOR DEVICES

(71) Applicant: Samsung Electronics Co., Ltd., Suwon-si, Gyeonggi-do (KR)

(72) Inventor: Seok-Han Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/198,990

(22) Filed: Jun. 30, 2016

(65) Prior Publication Data
US 2017/0053802 A1    Feb. 23, 2017

(30) Foreign Application Priority Data

Aug. 17, 2015 (KR) ........................ 10-2015-0115253

(51) Int. Cl.
| | |
|---|---|
| *H01L 21/033* | (2006.01) |
| *H01L 21/311* | (2006.01) |
| *H01L 21/3213* | (2006.01) |
| *G03F 7/00* | (2006.01) |
| *H01L 27/108* | (2006.01) |
| *H01L 21/768* | (2006.01) |

(52) U.S. Cl.
CPC ........ *H01L 21/0337* (2013.01); *G03F 7/0002* (2013.01); *H01L 21/31144* (2013.01); *H01L 21/32139* (2013.01); *H01L 21/76816* (2013.01); *H01L 27/10814* (2013.01); *H01L 27/10823* (2013.01); *H01L 27/10852* (2013.01); *H01L 27/10876* (2013.01); *H01L 27/10885* (2013.01); *H01L 27/10894* (2013.01)

(58) Field of Classification Search
CPC ............. H01L 21/0338; H01L 21/0335; H01L 21/0337
See application file for complete search history.

(56) References Cited

U.S. PATENT DOCUMENTS

2015/0104946 A1    4/2015 Park et al.
2016/0254153 A1*   9/2016 Park .................... H01L 21/0338

\* cited by examiner

*Primary Examiner* — Duy Deo
*Assistant Examiner* — Mahmoud Dahimene
(74) *Attorney, Agent, or Firm* — Ward and Smith, P.A.

(57) ABSTRACT

In a method of forming patterns of a semiconductor device, an object layer is formed on a substrate. A plurality of guiding pillars and at least one guiding dam are formed on the object layer. A self-aligned layer including a block copolymer is formed in a space between the guiding pillars and the guiding dam, such that first blocks aligned around the guiding pillars and second blocks aligned around the guiding dam are formed. A trim pattern at least partially covering the guiding dam is formed. The first blocks are transferred in the object layer.

13 Claims, 31 Drawing Sheets

METHODS OF FORMING PATTERNS OF SEMICONDUCTOR DEVICES

CROSS-REFERENCE TO RELATED APPLICATION

This application claims priority under 35 USC §119 to Korean Patent Application No. 10-2015-0115253, filed on Aug. 17, 2015 in the Korean Intellectual Property Office (KIPO), the contents of which are incorporated by reference herein in its entirety.

FIELD

Example embodiments relate to methods of forming patterns of semiconductor devices. More particularly, example embodiments relate to methods of forming patterns having a minute dimension of semiconductor devices.

BACKGROUND

As a degree of integration and a capacity of a semiconductor device become increased, methods of forming patterns of fine and minute dimensions have been researched. In a conventional photolithography process, e.g., an exposure device has been developed for forming the fine and minute patterns. However, a pattern having a critical dimension below a specific level is generally difficult to obtain through the photolithography process at least due to a resolution limit. Thus, a double patterning method (e.g., using at least two mask types) has been researched. However, the double patterning method may require complicated steps and excessive process costs.

Accordingly, a direct self assembly (DSA) method using a block copolymer has been developed.

SUMMARY

Example embodiments provide a method of forming patterns of a semiconductor device using a DSA method.

Example embodiments provide a method of manufacturing a semiconductor device using a DSA method.

According to example embodiments, there is provided a method of forming patterns of a semiconductor device. In the method, an object layer may be formed on a substrate. A plurality of guiding pillars and at least one guiding dam may be formed on the object layer. A self-aligned layer including a block copolymer may be formed in a space between the guiding pillars and the guiding dam, such that first blocks aligned around the guiding pillars and second blocks aligned around the guiding dam may be formed. A trim pattern at least partially covering the guiding dam may be formed. The first blocks may be transferred in the object layer.

In example embodiments, the first blocks may be aligned in a grid arrangement and the second blocks may be arranged linearly along a sidewall of the guiding dam.

In example embodiments, the first blocks may be removed to form first holes and the second blocks may be removed to form second holes. At least one second hole column arranged in a straight line may be formed by the second holes.

In example embodiments, the trim pattern may at least partially cover the second hole column.

In example embodiments, the trim pattern may be formed using the second hole column as an align key.

In example embodiments, in transferring the first blocks in the object layer, the object layer may be etched through the first holes to form first contact holes.

In example embodiments, an inner region in which the guiding pillars are included may be defined by the guiding dam, and the self-aligned layer may be also formed at an outer region of the guiding dam.

In example embodiments, in forming the self-aligned layer, fourth blocks aligned around the guiding dam may be formed at the outer region. A portion of the self-aligned layer except for the first blocks, the second blocks and the fourth blocks, may be defined as a third block.

In example embodiments, the fourth blocks may be removed to form fourth holes. At least one fourth hole column arranged in a straight line may be formed by the fourth holes, and the trim pattern may cover the fourth hole column.

In example embodiments, the first blocks, the second blocks and the fourth blocks may include polymethylmethacrylate (PMMA), and the third block may include polystyrene (PS).

In example embodiments, the guiding dam may include a plurality of guiding patterns arranged along a straight line. A slit may be formed between neighboring ones of the plurality of the guiding patterns.

In example embodiments, the slit may have a width capable of blocking an entrance of the block copolymer included in the self-aligned layer.

According to example embodiments, there is provided a method of forming patterns of a semiconductor device. The method includes forming on an object layer formed on substrate at least one guiding dam and a plurality of guiding pillars, wherein a self-aligned layer is formed including polymethylmethacrylate (PMMA) and polystyrene (PS), wherein the PMMA forms first pillars radially expanded around at least one of the guiding pillars and second pillars are arranged around the guiding dam; and forming a trim pattern on the object layer. The PMMA may form first pillars radially expanded in a hexagonal arrangement around at least one of the guiding pillars. The second pillars may be arranged substantially linearly around the guiding dam. Forming the self-aligned layer may include forming first blocks aligned around the plurality of guiding pillars. The first blocks may be transferred to the object layer.

According to example embodiments, there is provided a method of forming patterns of a semiconductor device. In the method, an object layer may be formed on a substrate. First blocks and second blocks may be formed from a block copolymer on the object layer. The first blocks may be aligned in a grid arrangement, and the second blocks may be arranged in a straight line. A trim pattern may be formed on the object layer using the second blocks as an align key. The first blocks may be transferred in the object layer.

In example embodiments, in forming the first blocks and the second blocks, a plurality of guiding pillars and at least one guiding dam may be formed on the object layer. The block copolymer may be coated in a space between the guiding pillars and the guiding dam to form the first blocks aligned around the guiding pillars and the second blocks aligned around the guiding dam.

In example embodiments, in forming the guiding pillars and the guiding dam, guide rings and a guide frame may be formed on the object layer. Pillars and a dam may be formed in the guide rings and the guide frame, respectively.

In example embodiments, the guide rings and the guide frame may be formed concurrently using the same material. The pillars and the dam may be formed concurrently using the same material.

In example embodiments, the guiding pillars may be surrounded by the guiding dam.

According to example embodiments, there is provided a method of manufacturing a semiconductor device. In the method, a plurality of active patterns defined by an isolation layer may be formed. Gate structures may be formed on the active patterns. An insulating interlayer covering the gate structures may be formed on the active patterns. A plurality of guiding pillars and at least one guiding dam may be formed on the insulating interlayer. A block copolymer may be coated in a space between the guiding pillars and the guiding dam to form first blocks aligned around the guiding pillars and second blocks aligned around the guiding dam. The first blocks and the second blocks may be removed to form first holes and second holes, respectively. A trim pattern at least partially covering the guiding dam may be formed. The first holes may be transferred in the insulating interlayer to form contact holes partially exposing the active patterns.

In example embodiments, contacts filling the contact holes may be formed. A capacitor may be formed on at least one of the contacts.

In example embodiments, the active patterns may be formed by partially etching substrate that may include a cell region and a peripheral circuit region. The trim pattern may cover the peripheral circuit region.

BRIEF DESCRIPTION OF THE DRAWINGS

Example embodiments will be more clearly understood from the following detailed description taken in conjunction with the accompanying drawings.

FIGS. 1 to 22 are top plan views and cross-sectional views illustrating a method of forming patterns of a semiconductor device in accordance with example embodiments;

FIGS. 23 and 24 are a top plan view and a cross-sectional view, respectively, illustrating a method of forming patterns of a semiconductor device in accordance with some example embodiments;

FIGS. 25 to 30 are top plan views and cross-sectional views illustrating a method of forming patterns of a semiconductor device in accordance with some example embodiments;

FIGS. 31 to 34 are top plan views and cross-sectional views illustrating a method of forming patterns of a semiconductor device in accordance with some example embodiments; and FIGS. 35 to 43 are a top plan view and cross-sectional views illustrating a method of manufacturing a semiconductor device in accordance with example embodiments.

DESCRIPTION OF EMBODIMENTS

Figure 1:
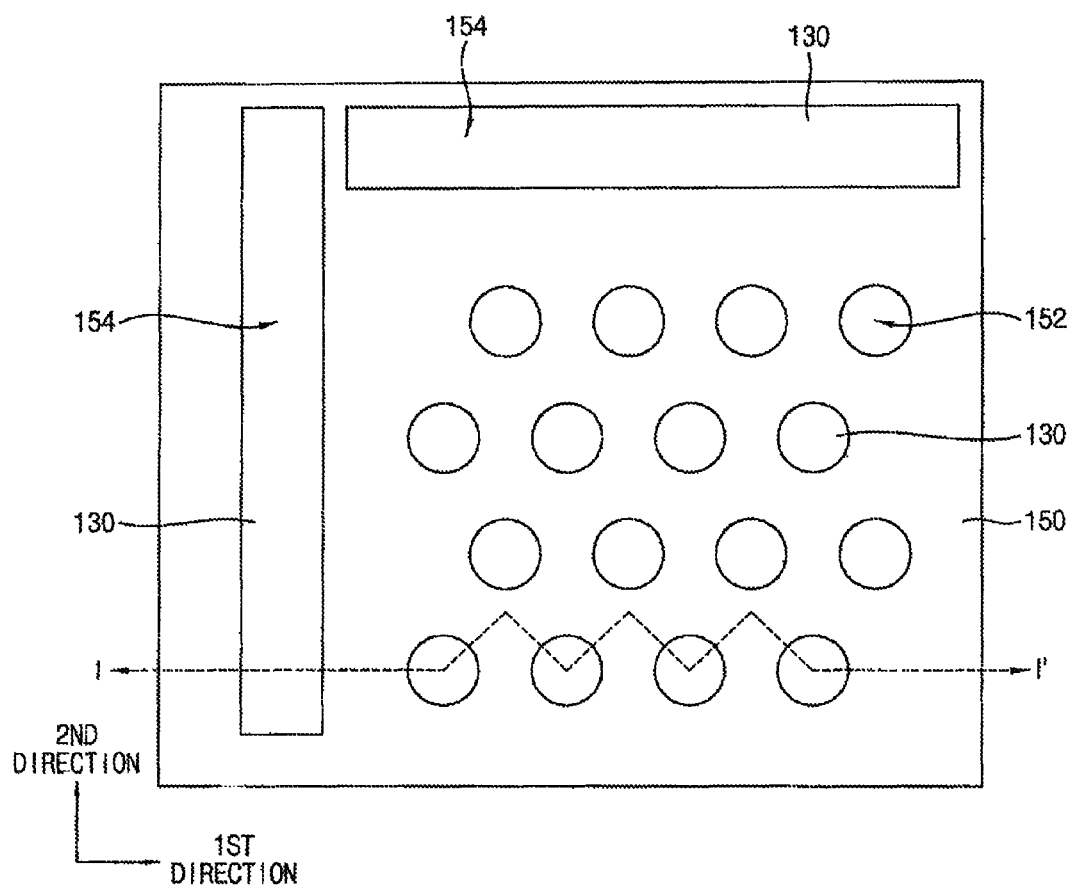
FIGS. 1 to 43 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive, concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc may be used herein to describe various elements, components, regions, layers and/or sections, these elements, components, regions, layers and/or sections should not be limited by these terms. These, terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, embodiments of the present inventive concept may comprise, consists essentially of or consists of the steps and/or elements described herein in relation to the present inventive concept.

Example embodiments are described herein with reference to cross-sectional illustrations that are schematic illustrations of idealized example embodiments and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 22 are top plan views and cross-sectional views illustrating a method of forming patterns of a semiconductor device in accordance with example embodiments.

Specifically, FIGS. 1, 3, 5, 7, 9, 11, 13, 15, 17 and 19 are top plan views illustrating the method. FIGS. 2, 4, 6, 8, 10, 12, 14, 16, 18, 20, 21 and 22 are cross-sectional views taken along a line I-I' indicated in the top plan views.

In FIGS. 1 to 22, two directions parallel to a top surface of a substrate, and crossing each other are defined as a first direction and a second direction. For example, the first direction and the second direction may be perpendicular to each other. The definitions of the directions are the same throughout other figures in this specification unless otherwise described.

Figure 2:
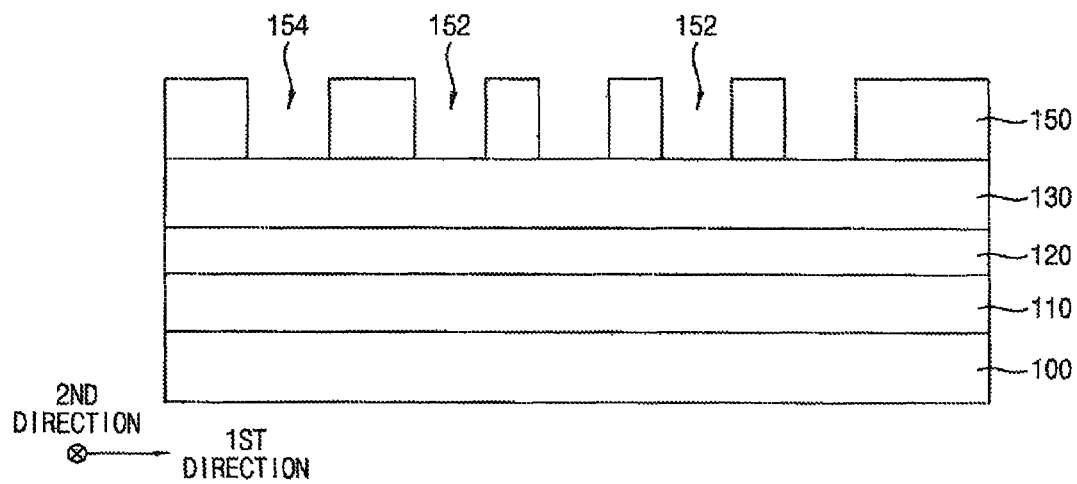

Referring to FIGS. 1 and 2, an object layer 110, an intermediate layer 120 and a sacrificial layer 130 may be sequentially formed on a substrate 100, and a mask pattern 150 may be formed on the sacrificial layer 130.

The substrate 100 may include silicon, germanium, silicon-germanium or a group III-V compound such as GaP, GaAs, GaSb, etc. In some embodiments, the substrate 100 may be a silicon-on-insulator (SOI) substrate or a germanium-on-insulator (GOI) substrate.

The object layer 110 may be partially etched to be converted into a pattern including a plurality of holes or openings. In some embodiments, the object layer 110 may be formed of an insulation material, e.g., a silicon oxide-based material such as plasma enhanced oxide (PEOX), tetraethyl orthosilicate (TEOS), flowable oxide (FOX), silicate glass, etc. In some embodiments, the object layer 110 may be formed of a conductive material, e.g., doped polysilicon, a metal, a metal nitride and/or a metal silicide.

The intermediate layer 120 may be formed of a material having an etching selectivity with respect to the object layer 110, in some embodiments, the intermediate layer 120 may be formed of silicon nitride, silicon oxynitride, silicon carbonitride and/or silicon carbide. The intermediate layer 120 may serve as an etch-stop layer or an etching mask layer with respect to the object layer 110. The intermediate layer 120 may include a plurality of layers.

The sacrificial layer 130 may be formed of a material having an etching selectivity with respect to the intermediate layer 120 and a guide layer 160 (see FIGS. 5 and 6) formed by a subsequent process. In some embodiments, the sacrificial layer 130 may be formed of a silicon or carbon-based spin-on hardmask (SOH) material.

A mask layer including, e.g., a photoresist material may be formed on the sacrificial layer 130, and exposure and developing processes may be performed on the mask layer to form the mask pattern 150. The mask pattern 150 may include preliminary holes 152 and preliminary openings 154 therein. A top surface of the sacrificial layer 130 may be exposed through the preliminary holes 152 and the preliminary openings 154.

In example embodiments, a plurality of the preliminary holes 152 may be formed along the first direction to form a preliminary hole row. A plurality of the preliminary hole rows may be formed along the second direction. The preliminary holes 152 included in the different preliminary hole rows may form a zigzag arrangement.

In example embodiments, the preliminary opening 154 may have a trench shape extending linearly. In some embodiments, as illustrated in FIG. 1, the preliminary holes 152 may be surrounded by a plurality of the preliminary openings 154 extending the first direction and/or the second direction.

In FIG. 1, the preliminary opening 154 extending in the first direction and the preliminary opening 154 extending in the second direction are illustrated as being separated from each other. However, the preliminary openings 154 extending in the first and second directions may be merged with each other to provide a single or unitary opening.

The object layer 110, the intermediate layer 120 and the sacrificial layer 130 may be formed by, e.g., a physical vapor deposition (PVD) process, a chemical vapor deposition (CVD) process, an atomic layer deposition (ALD) process or a sputtering process. In some embodiments, the sacrificial layer 130 and the mask layer may be formed by, e.g., a spin coating process.

Figure 3:
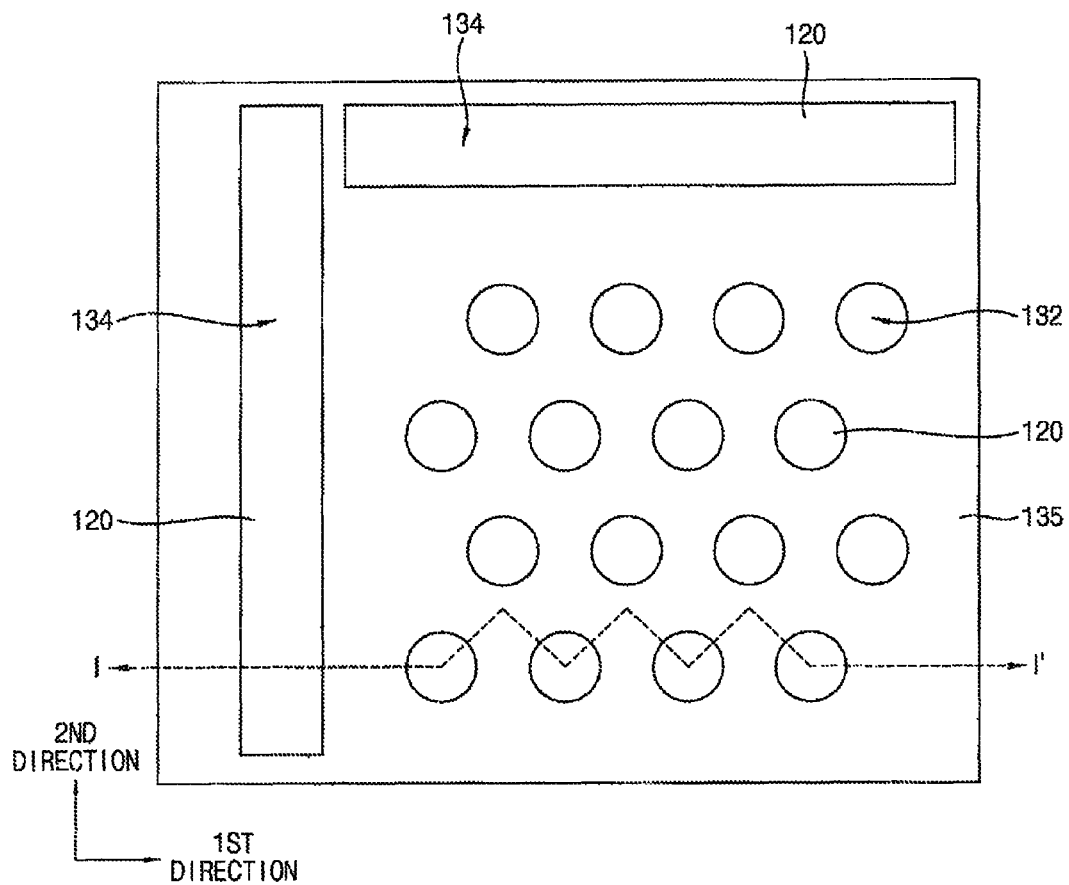
Figure 4:
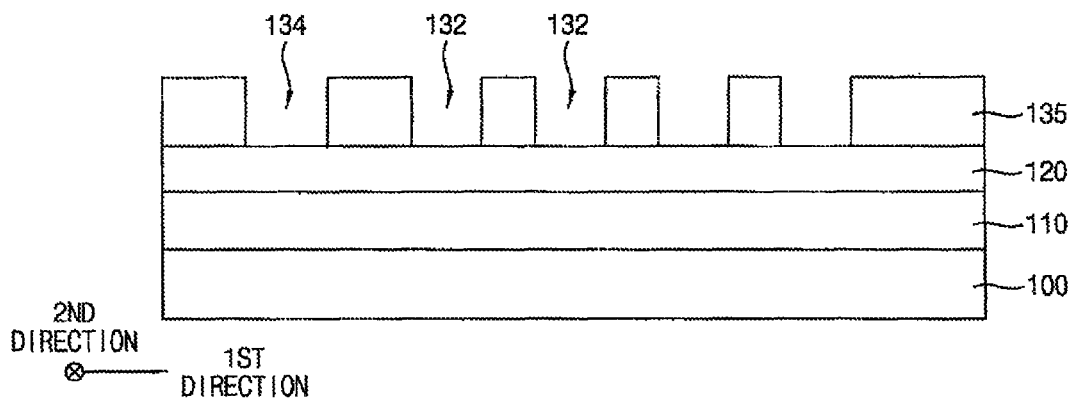

Referring to FIGS. 3 and 4, the sacrificial layer 130 may be partially removed using the mask pattern 150 as an etching mask to form a sacrificial pattern 135.

In example embodiments, the preliminary hole 152 and the preliminary opening 154 may be transferred in the sacrificial layer 130 to form the sacrificial pattern 135 including a hole 132 and an opening 134. The hole 132 and the opening 134 may be formed in arrangements substantially the same as or similar to those of the preliminary holes 152 and the preliminary opening 154. In example embodiments, a plurality of the holes 132 may be arranged in the first direction to form a hole row, a plurality of hole rows may be arranged in the second direction, and the holes 132 included in the different hole rows may form a zigzag arrangement. The opening 134 may extend in the first direction and/or the second direction, and may surround the holes 132.

The mask pattern 150 may be removed by an ashing process and/or a strip process after forming the sacrificial pattern 135. For example, a top surface of the intermediate layer 120 may be exposed through the hole 132 and the opening 134.

Figure 5:
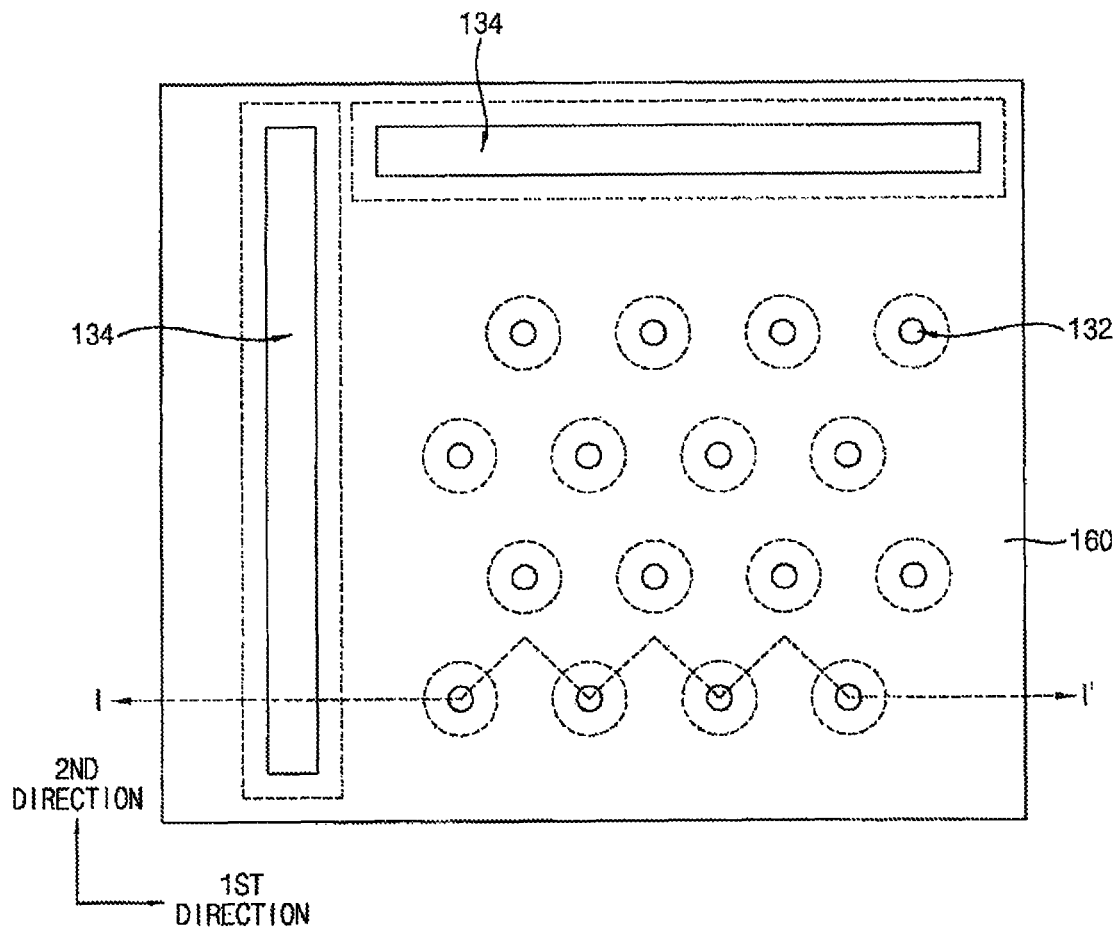
Figure 6:
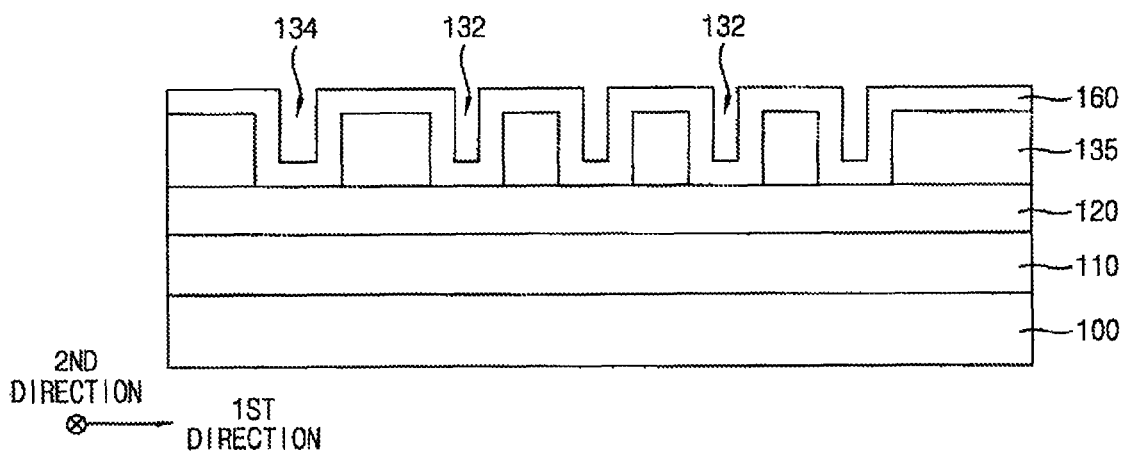

Referring to FIGS. 5 and 6, the guide layer 160 may be formed on the sacrificial pattern 135.

The guide layer 160 may be formed using a material and a process condition having improved step-coverage and/or conformability. For example, the guide layer 160 may be formed of a middle temperature oxide (MTO), a high temperature oxide (HTO) or an ALD oxide by an ALD process. In some embodiments, the guide layer 160 may be formed of the ALD oxide.

The guide layer 160 may be formed conformably along a surface of the sacrificial pattern 135, and the top surface exposed through the hole 132 and the opening 134. The hole 132 and the opening 134 may be partially filled with the guide layer 160.

Figure 7:
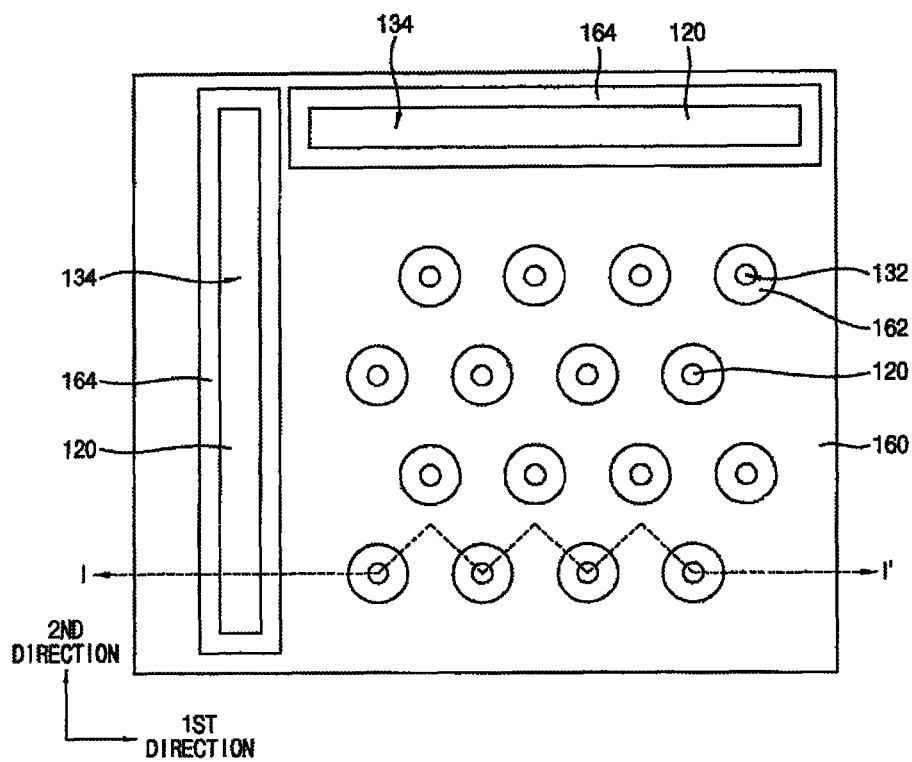
Figure 8:
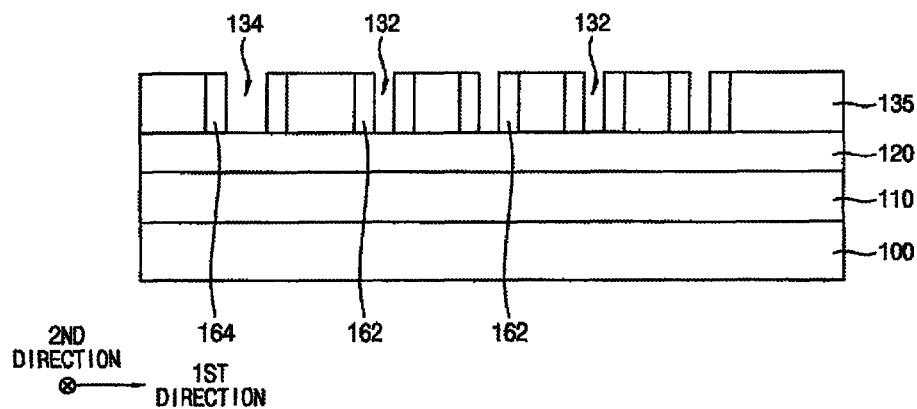

Referring to FIGS. 7 and 8, the guide layer 160 may be partially removed by, e.g., an anisotropic etch process or an etch-back process. In example embodiments, portions of the guide layer 160 formed on top surfaces of the sacrificial pattern 135 and the intermediate layer 120 may be removed. Accordingly, a guide ring 162 may be formed on a sidewall of each hole 132, and a guide frame 164 may be formed on a sidewall of the opening 134.

In some embodiments, the guide frame 164 extending in the first direction and the guide frame 164 extending in the second direction may be connected to or integral with each other.

In example embodiments, a plurality of the guide rings 162 may be formed to be spaced apart from each other within a region confined by the guide frame 164. A width of the hole 132 and a width of the opening 134 may be reduced by the guide ring 162 and the guide frame 164, respectively.

Figure 9:
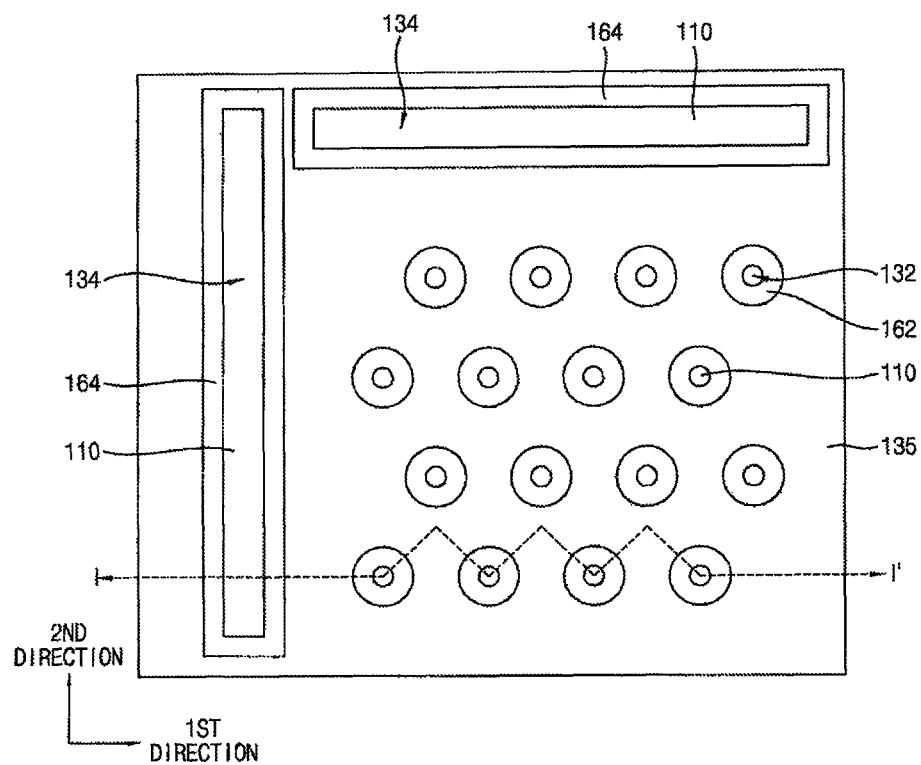
Figure 10:
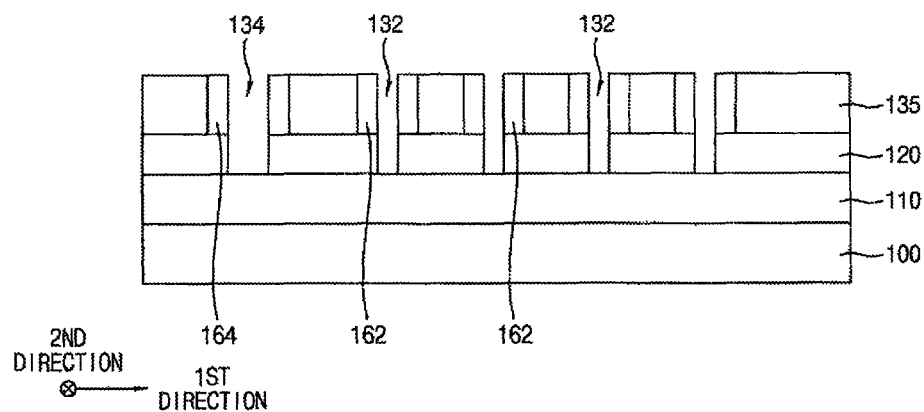

Referring to FIGS. 9 and 10, the intermediate layer 120 may be partially etched through the hole 132 and the opening 134 having the reduced widths such that the hole 132 and the opening 134 may extend in the intermediate layer 120.

In some embodiments, a top surface of the object layer 110 may be exposed through the hole 132 and the opening 134 having expanded heights. In some embodiments, an additional layer such as an etch-stop layer may be formed on the object layer 110. In this case, a top surface of the etch-stop layer may be exposed through the hole 132 and the opening 134.

Figure 11:
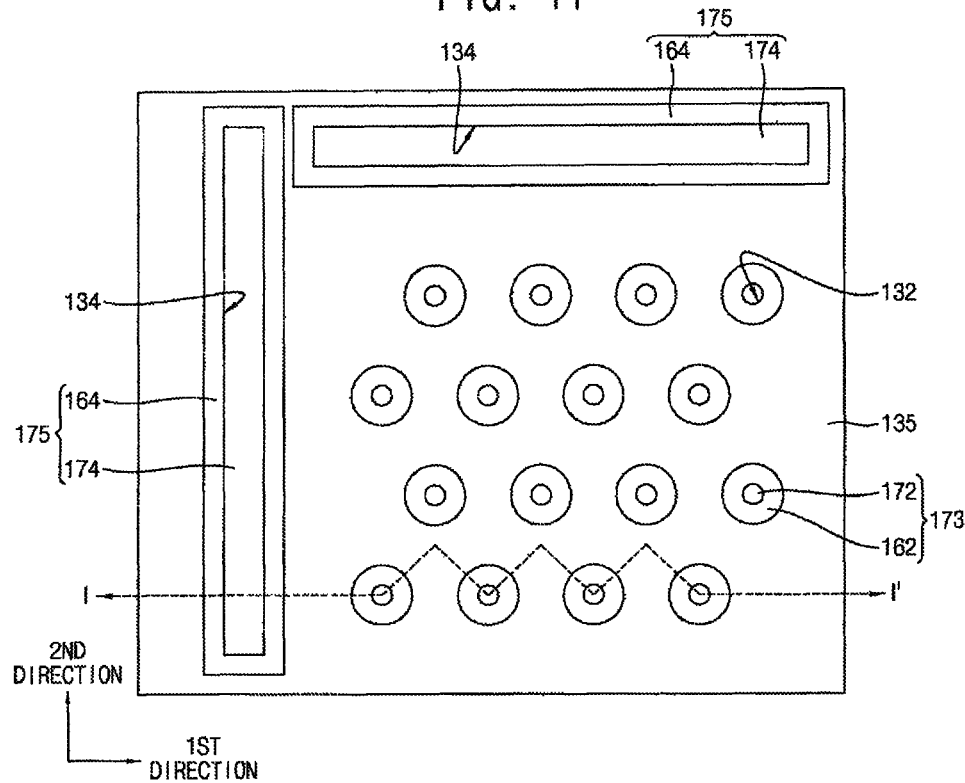
Figure 12:
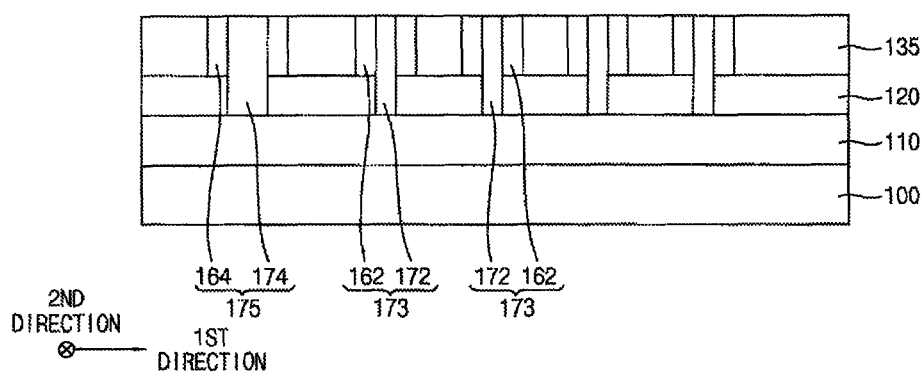

Referring to FIGS. 11 and 12, a pillar 172 and a dam 174 may be formed in the hole 132 and the opening 134, respectively.

In example embodiments, at filling layer may be formed on the sacrificial pattern 135, the guide ring 162 and the guide frame 164 to fill the hole 132 and the opening 134. An upper portion of the filling layer may be planarized by, e.g., a chemical mechanical polish (CMP) process to form the pillar 172 and the dam 174. The sacrificial pattern 135 may substantially serve as a polish-stop layer during the CMP process.

The filling layer may be formed of, e.g., a silicon oxide-based material by a CVD process. In some embodiments, the filling layer may be formed of a material substantially the same as or similar to that of the guide layer 160.

In example embodiments, the guide ring 162 and the pillar 172 may serve as a guiding pillar 173. In some embodiments, the guide ring 162 and the pillar 172 may be merged with each other, and may be provided as a single or unitary member.

The guide frame 164 and the dam 174 may serve as a guiding dam 175. In some embodiments, the guide frame 164 and the dam 174 may be merged with each other, and may be provided as a single or unitary member.

Figure 13:
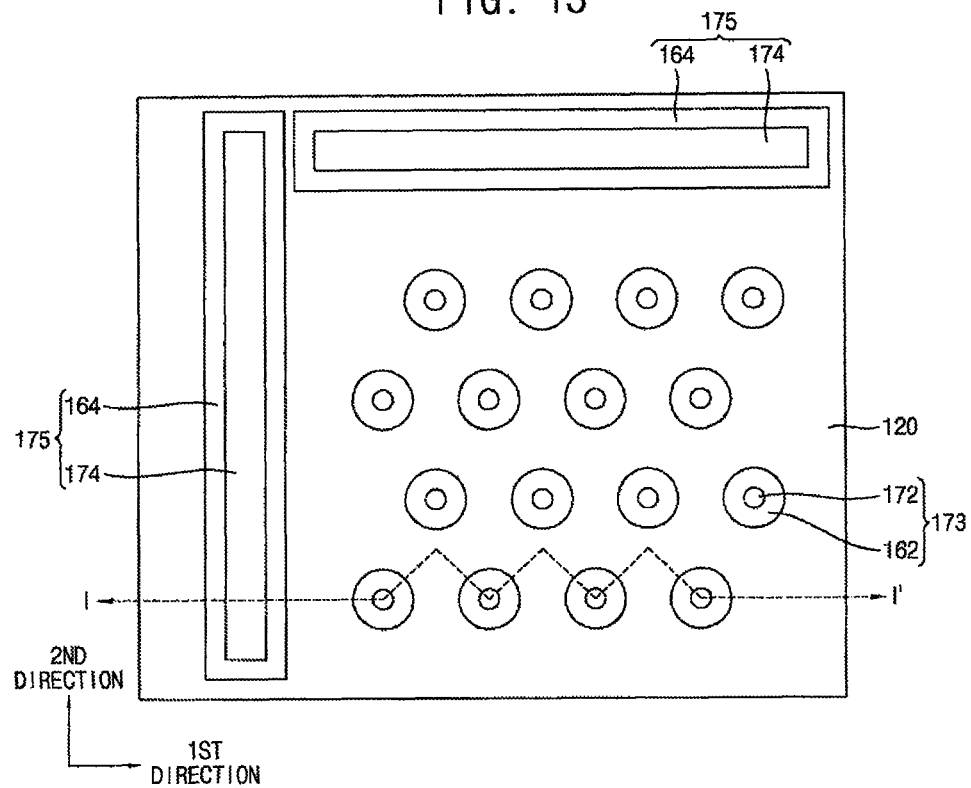
Figure 14:
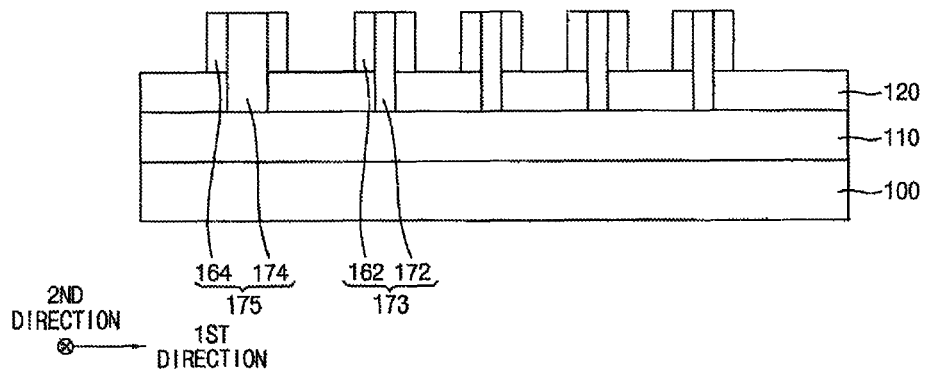

Referring to FIGS. 13 and 14, the sacrificial pattern 135 may be removed. For example, the sacrificial pattern 135 may be removed by an ashing process and/or a strip process.

The top surface of the intermediate layer 120 may be exposed after removing the sacrificial pattern 135. The guiding pillars 173 may protrude from the top surface of the intermediate layer 120. The guiding dam 175 may extend in the first direction and/or the second direction, and may surround the guiding pillars 173.

Figure 15:
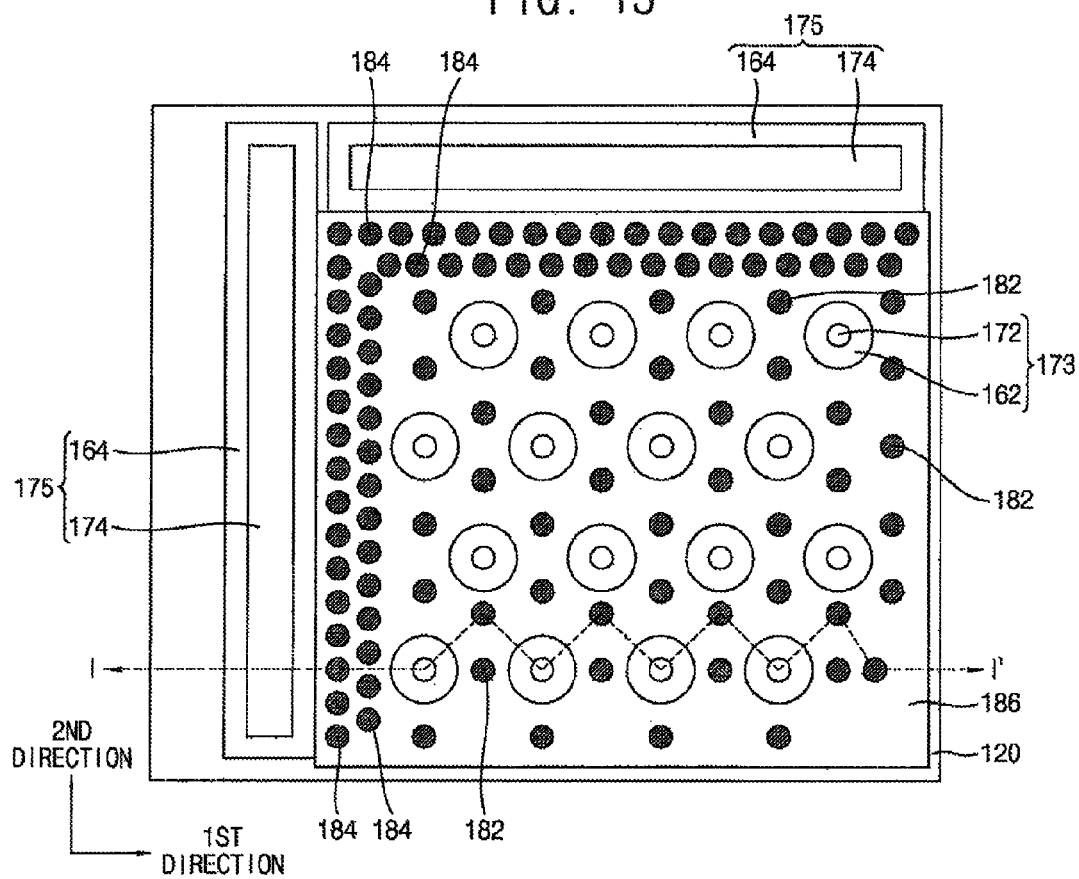
Figure 16:
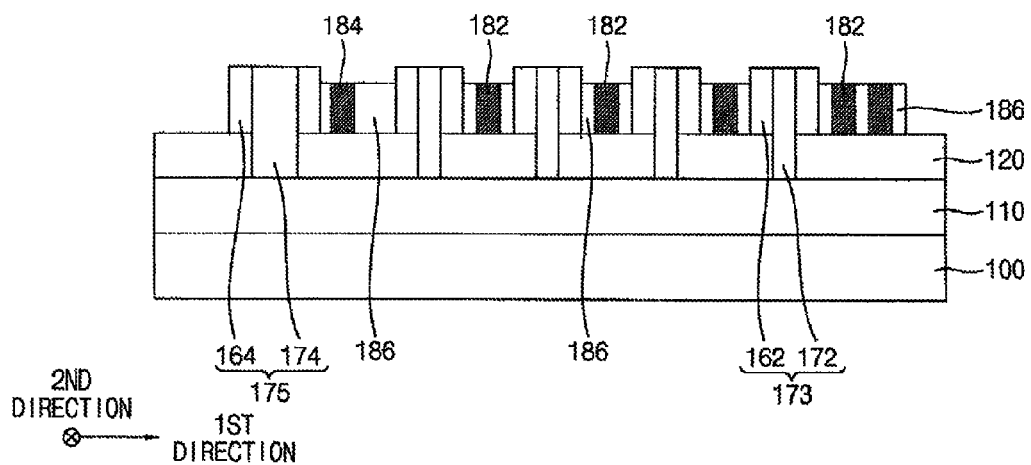

Referring to FIGS. 15 and 16, a self-aligned layer may be formed on the intermediate layer 120 to form blocks 182, 184 and 186 self-aligned or self-assembled by the guiding pillars 173 and the guiding dam 175.

In example embodiments, the self-aligned layer may be formed of a block copolymer including polymer units that may have different chemical properties. For example, a first polymer unit and a second polymer unit may be co-polymerized through, e.g., a cationic polymerization or an anionic polymerization to prepare the block copolymer.

For example, the first polymer unit may include polymethylmethacrylate, (PMMA), polydimethylsiloxane (PDMS), polyvinylpyrrolidone (PVP), polyethyleneoxide (PEO) or polyimide (PI). The second polymer unit may include, e.g., polystyrene (PS).

In this case, the block copolymer may be represented as PS-b-PMMA, PS-b-PDMS, PS-b-PVP, PS-b-PEO and PS-b-PI. In an embodiment, the self-aligned layer may be formed using PS-b-PMMA.

For example, the block copolymer may be dissolved in an organic solvent to prepare a composition. The composition may be coated on the intermediate layer 120 by, e.g., spin, coating process or a slit coating process. Additionally, the coated composition may be thermally cured by, e.g., an annealing process to form the self-aligned layer.

In some embodiments, the guiding dam 175 may serve as a mold or a partition wall. Thus, the self-aligned layer may be formed substantially within a region confined by the guiding dam 175, and may contact sidewalls of the guiding pillars 173.

The first polymer unit and the second polymer unit may be separated to be self-aligned or self-assembled due to chemical and/or physical differences generated by the guiding pillar 173 and the guiding dam 175. For example, the first polymer unit may be self-aligned or self-assembled to form a first block 182 and a second block 184. The second polymer unit may be self-assembled or self-aligned as a third block 186. The third block 186 may be defined as a portion of the self-aligned layer except for the first block 182 and the second block 184.

In some embodiments, the first block 182 and the second block 184 may include PMMA. The third block 186 may include PS.

As illustrated in FIG. 15, a plurality of the first blocks 182 may be aligned in a grid arrangement or a mesh arrangement. In some example embodiments, a plurality of the first blocks 182 may be aligned around one of the guiding pillars 173 to form a polygonal unit, and a plurality of the polygonal units may be formed. In an embodiment, six of the first blocks 182 may be aligned around the one of the guiding pillars 173 to form a hexagonal unit. In this case, one first block 182 may be aligned at a position corresponding to a central point of a triangle defined by three guiding pillars 173 neighboring each other.

However, the first blocks 182 may be aligned in various arrangements. For example, the first block 182 may be aligned at a central position between two neighboring guiding pillars 173. The first block 182 may be aligned at a central position of a quadrangle defined by four neighboring guiding pillars 173. In some embodiments, the first block 182 may be aligned to be in contact with an outer sidewall of the guiding pillar 173.

In example embodiments, the second blocks 184 may be aligned substantially linearly along a sidewall of the guiding dam 175. For example, a plurality of the second blocks 184 may be arranged along the second direction to form a second block column. A plurality of the second block columns may be formed along the first direction. Additionally, a plurality of the second blocks 184 may be arranged along the first direction to form a second block row. A plurality of the second block rows may be formed along the second direction.

In some embodiments, the second blocks 184 included in the neighboring second block columns or the neighboring second block rows may be aligned in a zigzag arrangement.

The third block 186 may be arranged at a region in which the first and second blocks 182 and 184 may not be formed. The third block 186 may surround sidewalls of the first blocks 182 and the second blocks 184.

Figure 17:
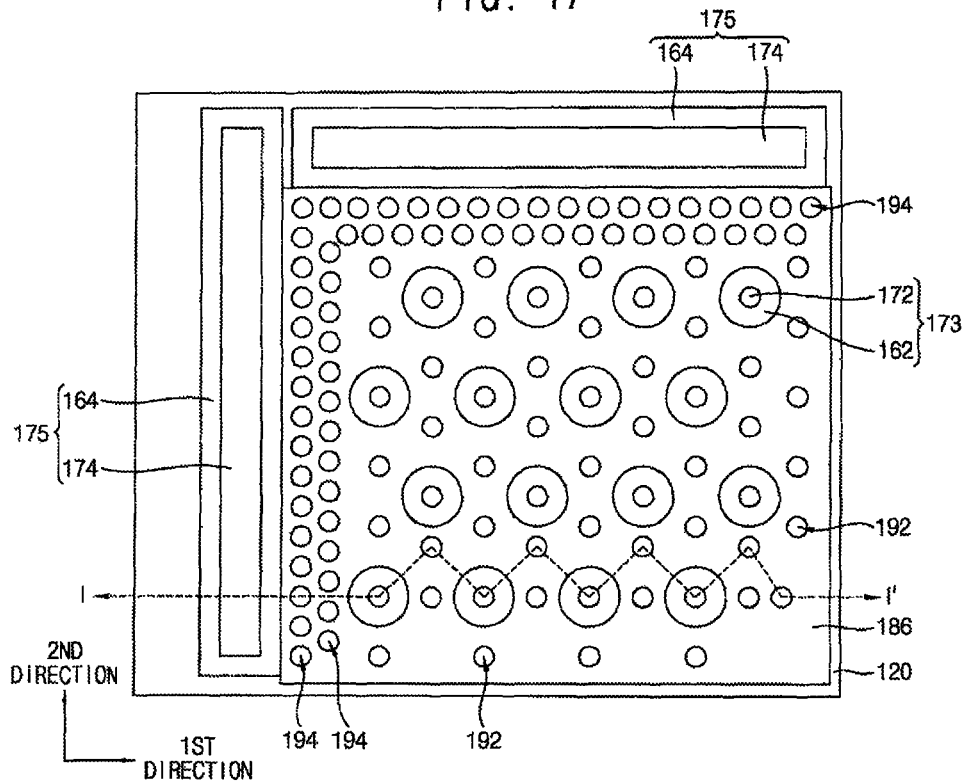
Figure 18:
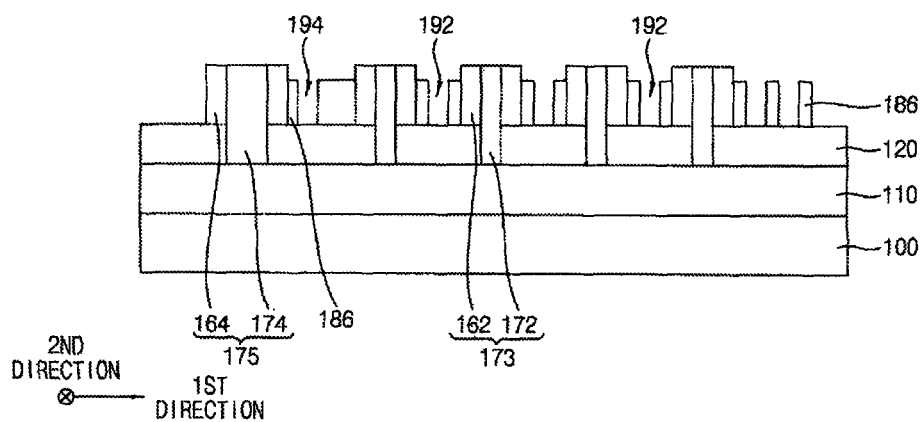

Referring to FIGS. 17 and 18, the first block 182 and the second block 184 may be removed.

In example embodiments, the first and second blocks 182 and 184 may be removed by a plasma etching process or a reactive ion etching (RIE) process using, e.g., oxygen. The first and second blocks 182 and 184 may include PMMA having a relatively strong hydrophilicity, and thus may have a relatively high affinity with respect to the plasma etching process or the RIE process. Thus, the first and second blocks 182 and 184 may be selectively removed.

A first hole 192 may be formed at a space from which the first block 182 may be removed. A second hole 194 may be formed at a space from which the second block 184 may be removed. A plurality of the first holes 192 may be formed in a grid arrangement or a mesh arrangement including, e.g., repeated hexagonal units comparable to the arrangement of the first blocks 182. A plurality of the second holes 194 may be arranged linearly to form a second hole row and/or a second hole column comparable to the arrangement of the second blocks 184.

Figure 19:
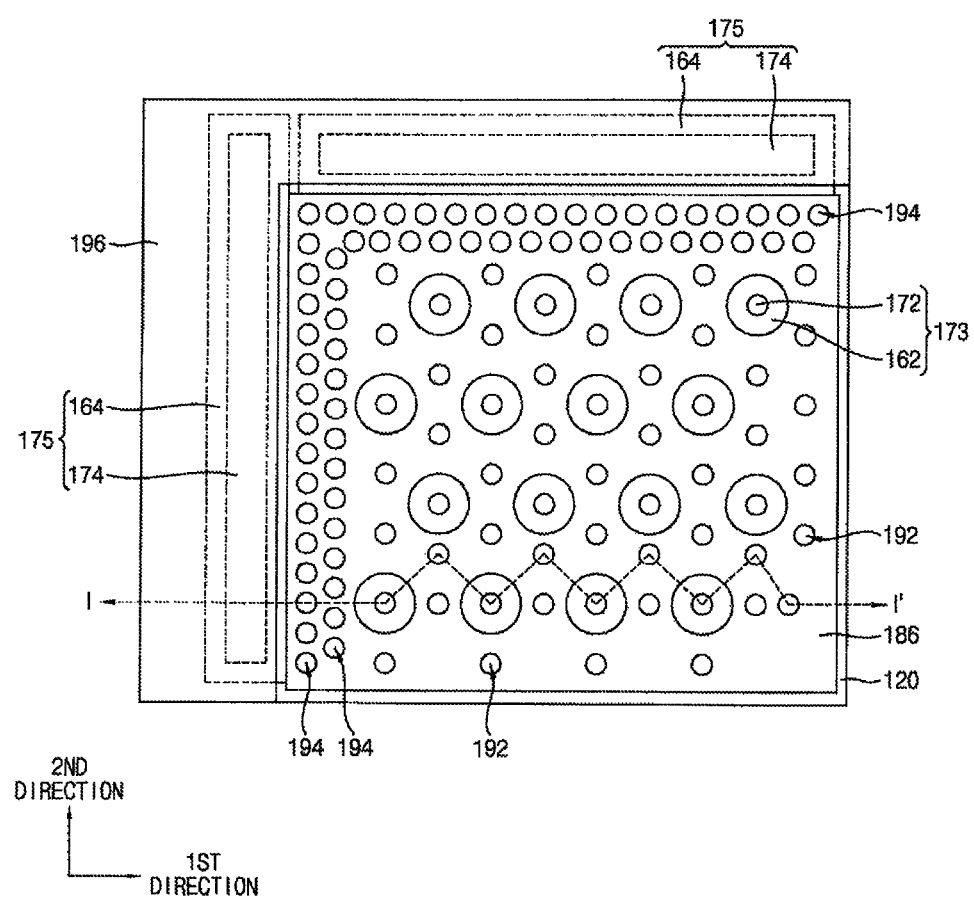
Figure 20:
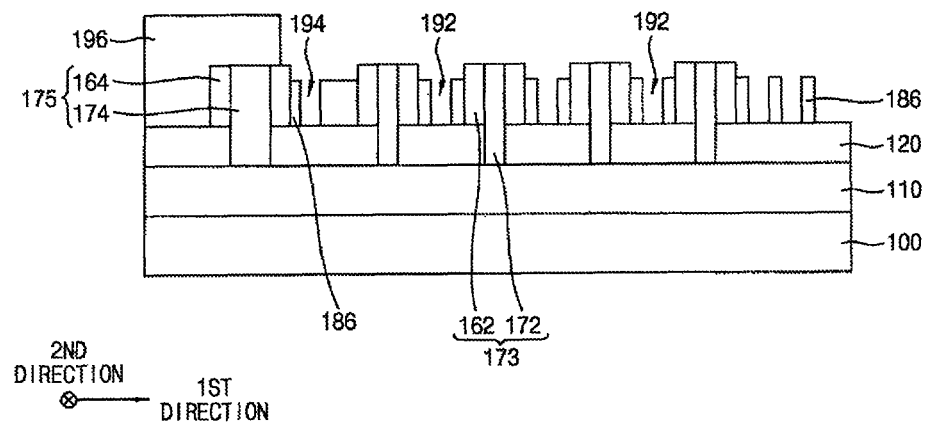

Referring to FIGS. 19 and 20, a trim pattern 196 covering the guiding dam 175 may be formed.

In example embodiments, the trim pattern 196 may include a photoresist material. For example, a photoresist layer covering the guiding pillar 173, the guiding dam 175 and the third block 186 may be formed on the intermediate layer 120. Exposure and developing processes may be performed to remove a portion of the photoresist layer formed at a region in which the first and second holes 192 and 194 are distributed. Accordingly, the trim pattern 196 covering the guiding dam 175 may be formed, and the first and second holes 192 and 194 may be exposed again.

In some embodiments, the trim pattern 196 may cover an outer region of the guiding dam 175. An inner region of the guiding dam 175 may be defined as a region in which the guiding pillars 173, the first holes 192 and the second holes 194 may be distributed. The trim pattern 196 may partially cover a top surface of the guiding dam 175.

In example embodiments, while forming the trim pattern 196, the second holes 194 formed from the second blocks 184 may be substantially utilized as, e.g., an align key or a reference pattern. As described above, the second holes 194 may be arranged linearly along the first direction and/or the second direction. Thus, the second hole column or the second hole row may serve as the align key or the reference pattern while performing the exposure process for forming the trim pattern 196.

In some embodiments, while aligning an exposure mask for forming the trim pattern 196, the second hole column or the second hole row may serve as the align key or the reference pattern.

In example embodiments, an aligning margin for setting a trim line may be further obtained from the guiding dam 175. Thus, a process efficiency and a process accuracy may be improved by using the align key defined by the second holes 194 with an increased trim margin.

Figure 21:
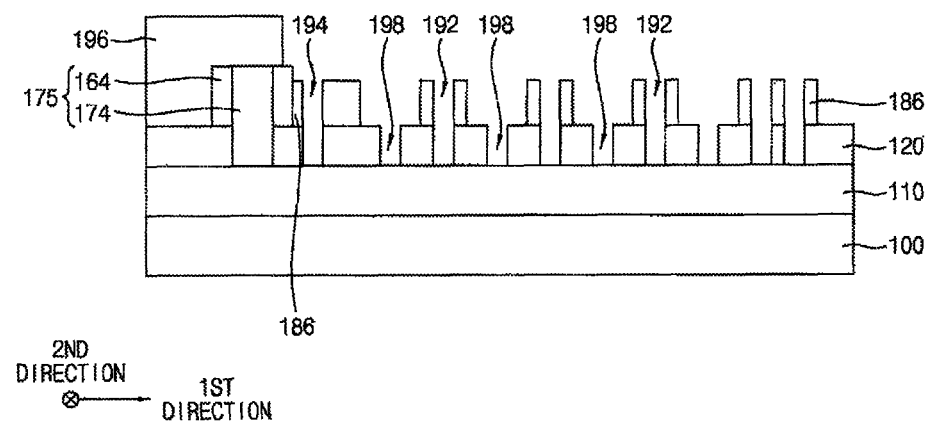

Referring to FIG. 21, portions of the intermediate layer 120 exposed through the first holes 192 and the second holes 194 may be removed. In some embodiments, if the intermediate layer 120 includes silicon nitride, the intermediate layer 120 may be partially removed using an etchant solution having an etching selectivity for a nitride such as phosphoric acid or nitric acid.

Accordingly, lengths or depths of the first and second holes 192 and 194 may be increased in the intermediate layer 120.

Additionally, the guiding pillar 173 may be removed. For example, an etchant solution such as fluoric acid, or an etching gas such as a fluoro carbon gas which may have an etching selectivity for an oxide may be utilized for removing the guiding pillars 173. A third hole 198 may be formed at a space from which the pillar 172 included in the guiding pillar 173 may be removed in the intermediate layer 172.

Figure 22:
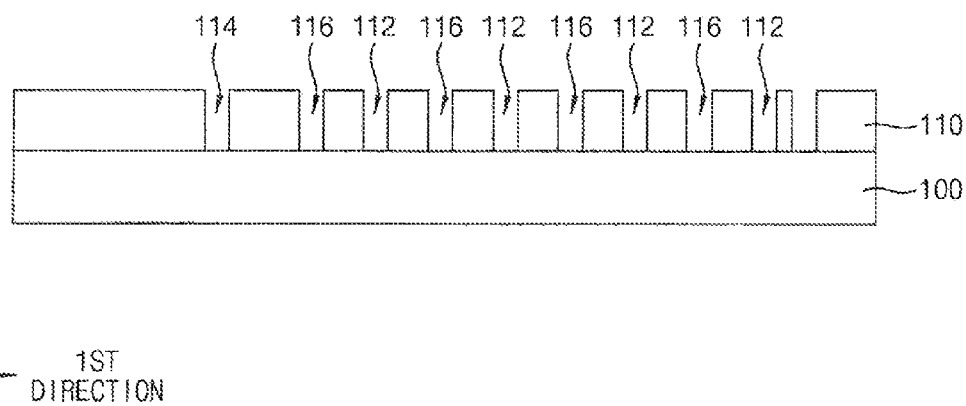

Referring to FIG. 22, contact holes may be formed in the object layer 110, In example embodiments, the first hole 192, the second hole 194 and the third hole 198 may be transferred in the object layer 110 to form a first contact hole 112, a second contact hole 114 and a third contact hole 116, respectively.

For example, after forming the first hole 192, the second hole 194 and the third hole 198 in the intermediate layer 120 as illustrated in FIG. 21, the remaining third block 186 and trim pattern 196 may be removed by an ashing process and/or a strip process. Thereafter, the object layer 110 may be partially removed using the intermediate layer 120 including the first hole 192, the second hole 194 and the third hole 198 as an etching mask to form the contact holes 112, 114 and 116. After forming the contact holes 112, 114 and 116, the remaining guiding dam 175 and intermediate layer 120 may be removed by, e.g., a CMP process.

In some embodiments, the second contact holes 114 that may be formed from the second blocks 184 arranged linearly may serve as dummy contact holes. The first and third contact holes 112 and 116 formed from the first blocks 182 and the pillars 172 may serve as real contact holes.

The contact holes having fine pitch and width may be formed by, e.g., a DSA method according to processes as described above. A trim line may be set or determined utilizing blocks arranged linearly, or holes formed from the blocks, so that the contact holes may be easily formed at desired regions.

The DSA method is exemplarily illustrated in FIGS. 1 to 22, and various modifications may be employed. For example, a guiding ring may be formed instead of the guiding pillar. In this case, the first block 182 may also be formed in the guiding ring.

In some embodiments, a neutral layer including a random copolymer, e.g., PS-r-PMMA may be further formed after forming the guiding pillar 173 and the guiding dam 175. In this case, the first to third blocks 182, 184 and 186 may be self-aligned or self-assembled on the neutral layer.

As described above, the trim pattern 196 may be formed using the second holes 194 as an align key or a reference pattern after forming the first and second holes 192 and 194 by removing the first and second blocks 182 and 184. In some example embodiments, the trim pattern 196 may be formed before removing the first blocks 182 and the second blocks 184. In this case, the second blocks 184 may serve as the align key or the reference pattern.

Figure 23:
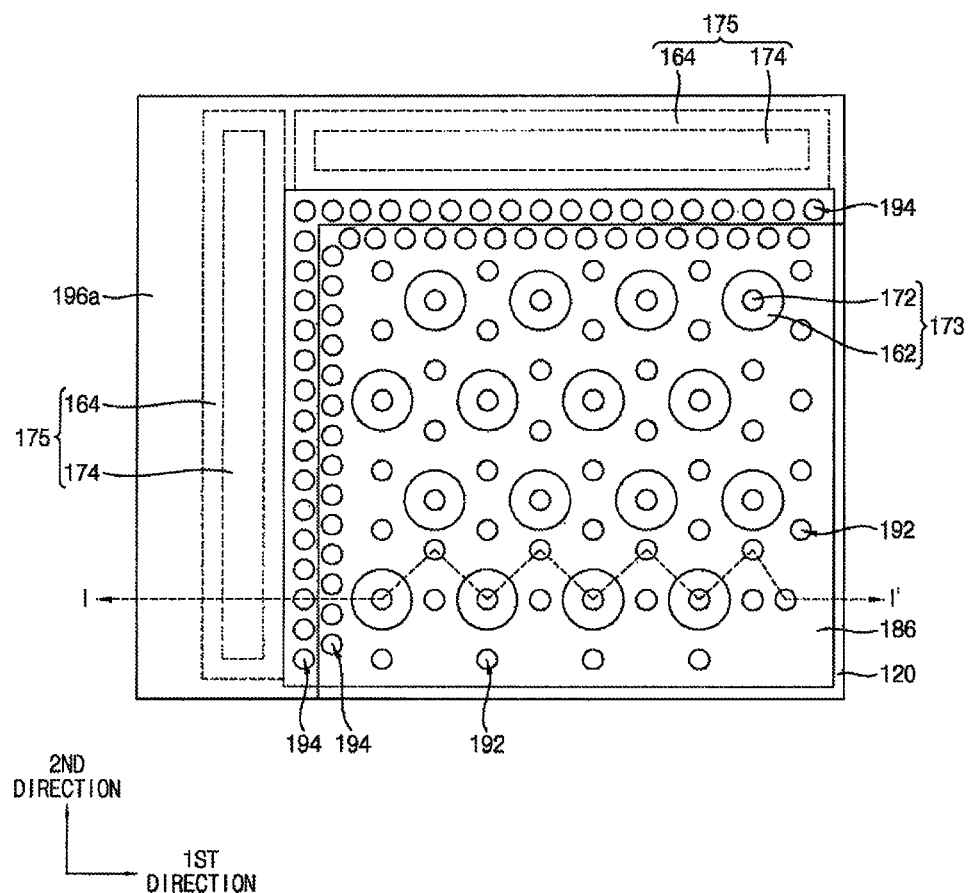
Figure 24:
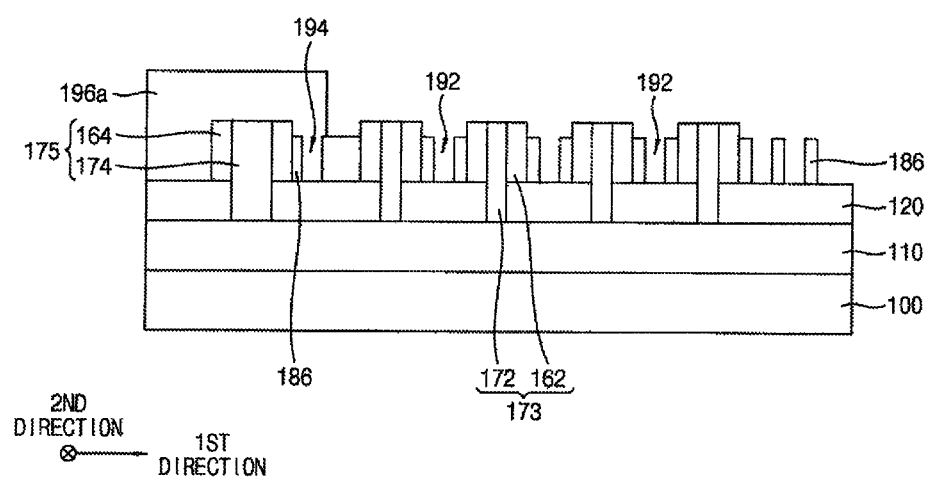

FIGS. 23 and 24 are a top plan view and a cross-sectional view, respectively, illustrating a method of forming patterns of a semiconductor device in accordance with some example embodiments. For example, FIG. 24 is a cross-sectional view taken along a line I-I' indicated in FIG. 23. Detailed descriptions on processes substantially the same as or similar to those illustrated with reference to FIGS. 1 to 22 are omitted herein.

Referring to FIGS. 23 and 24, processes substantially the same as or similar to those illustrated with reference to FIGS. 1 to 18 may be performed to form a trim pattern 196*a*.

In some example embodiments, the trim pattern 196a may substantially cover the guiding dam 175 and the outer region of the guiding dam 175, and may at least partially cover the second holes 194. In some example embodiments, the trim pattern 196a may fully cover the guiding dam 175 and the outer region of the guiding dam 175. In some example embodiments, the trim pattern 196a may only partially cover the second holes 194.

In some embodiments, the trim pattern 196a may cover at least one of a plurality of the second hole columns linearly arranged along the second direction. The trim pattern 196a may cover at least one of a plurality of the second hole rows linearly arranged along the first direction.

In some embodiments, the trim pattern 196a may entirely cover the second holes 194. In this case, while performing processes substantially the same as or similar to those illustrated with reference to FIGS. 21 and 22, the second contact hole 114 may not be formed in the object layer 110, and the first contact hole 112 and the third contact hole 116 may be only formed.

As described above, the second holes 194 may be arranged along a substantially straight line, and the second hole column and/the second hole row may serve as an align key or a reference pattern while forming the trim pattern 196a. Thus, a trim line may be formed precisely at a desired region.

In some embodiments, the second holes 194 may be provided as dummy holes, and a trim margin may be additionally achieved from the dummy holes. Accordingly, the trim line may be determined without damaging the first holes 192 that may be formed in a grid arrangement or a zigzag arrangement and may be transferred into real contact holes.

In some embodiments, the trim pattern 196a may be formed before removing the first blocks 182 and the second blocks 184 illustrated in FIGS. 15 and 16. In this case, the trim pattern 196a may cover the second block row and/or the second block column defined by the second blocks 184.

Figure 25:
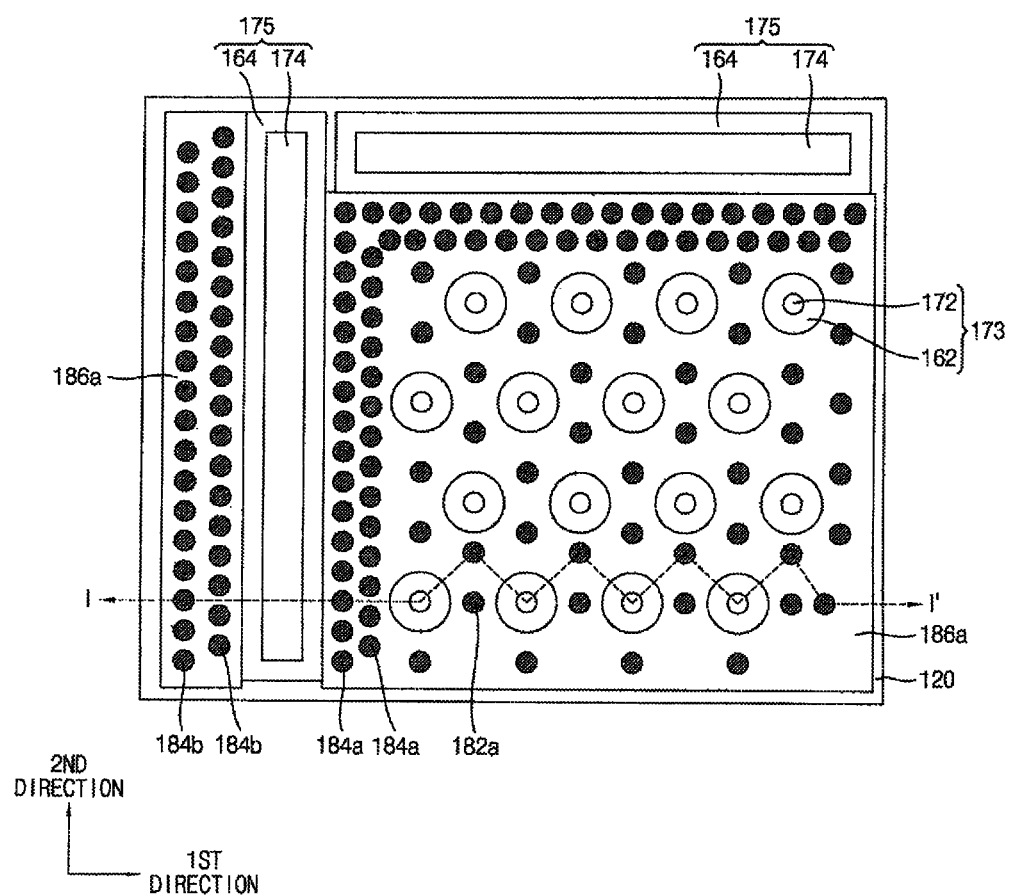
Figure 26:
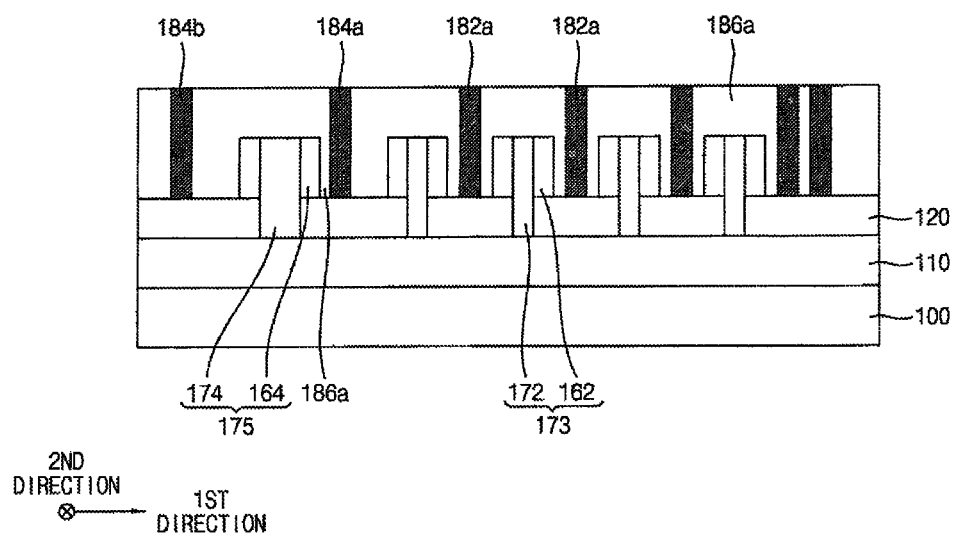
Figure 27:
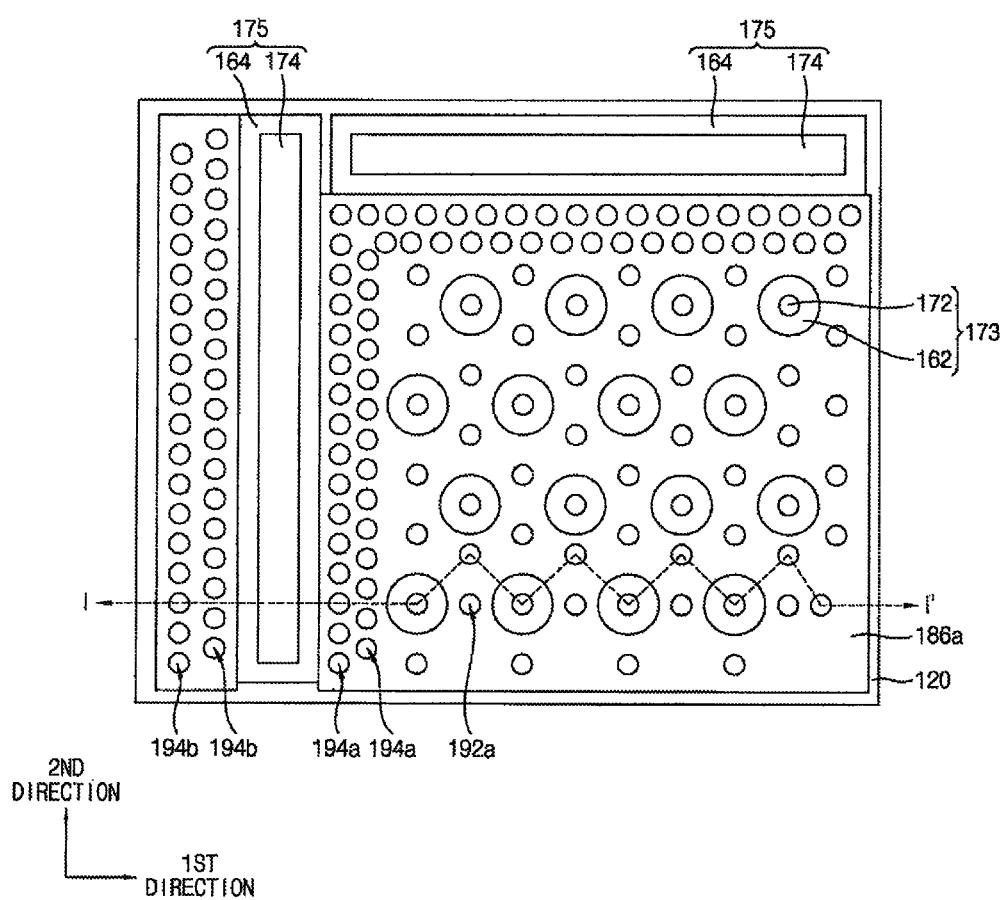
Figure 28:
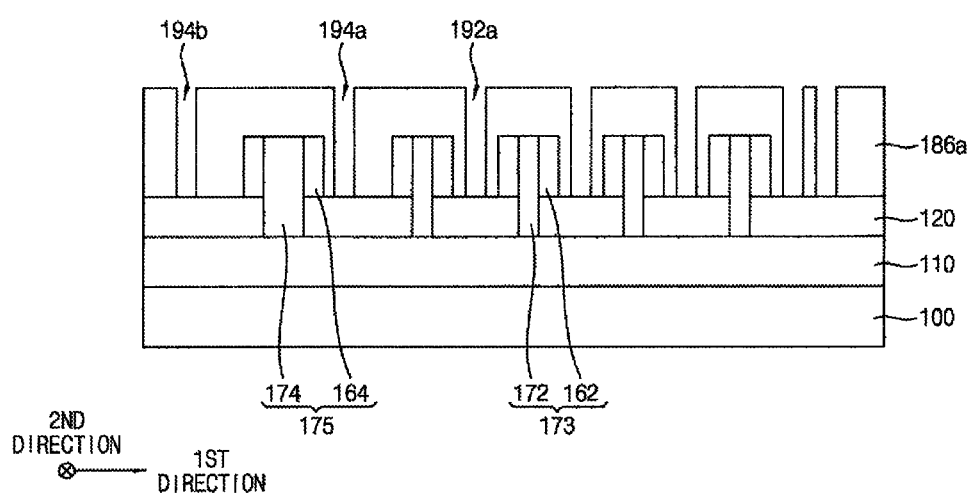
Figure 29:
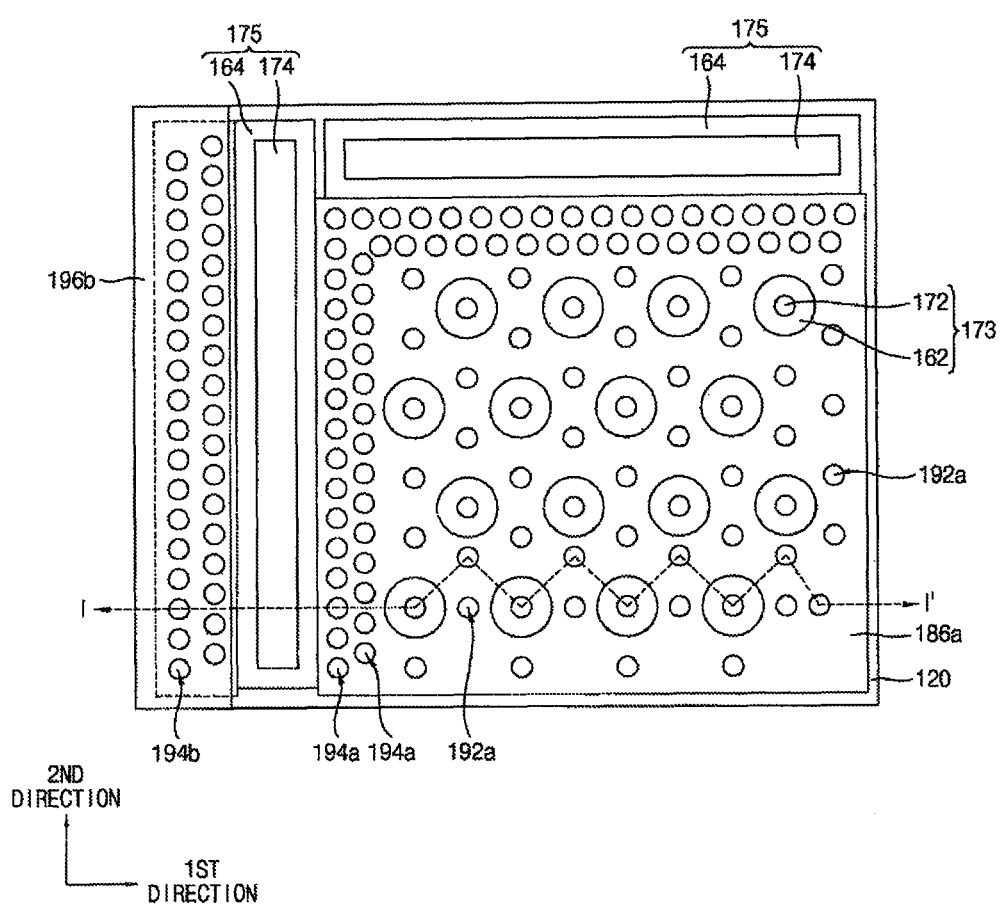
Figure 30:
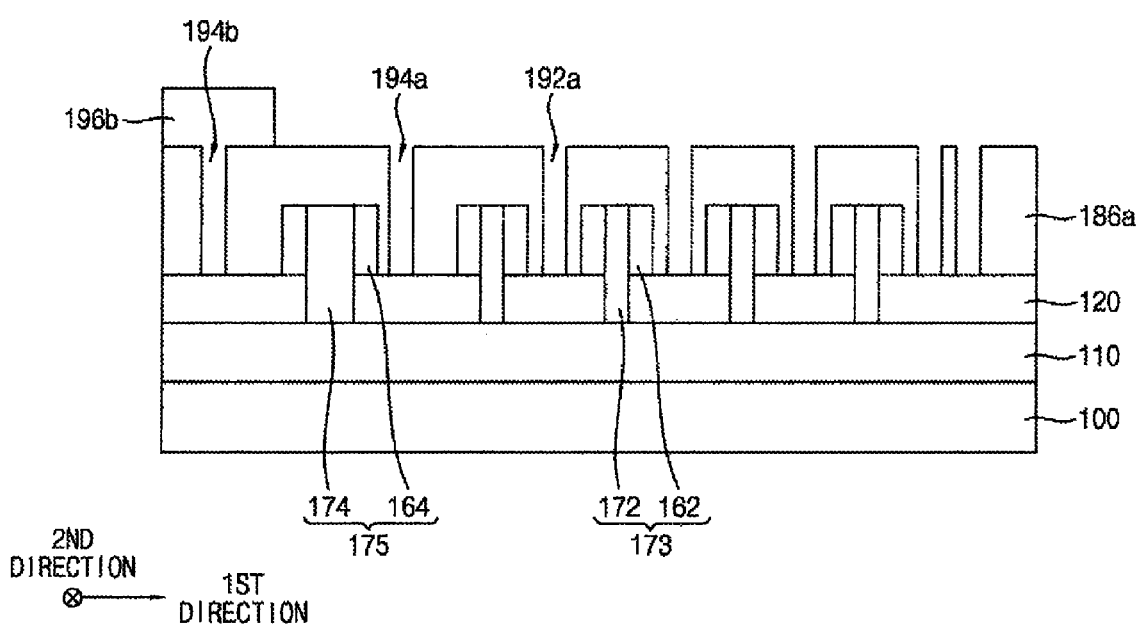

FIGS. 25 to 30 are top plan views and cross-sectional views illustrating a method of forming patterns of a semiconductor device in accordance with some example embodiments. Specifically, FIGS. 25, 27 and 29 are top plan views illustrating the method. FIGS. 26, 28 and 30 are cross-sectional views taken along a line I-I' indicated in FIGS. 25, 27 and 29.

Detailed descriptions on processes substantially the same as or similar to those illustrated with reference to FIGS. 1 to 22 are omitted herein.

Referring to FIGS. 25 and 26, processes substantially the same as or similar to those illustrated with reference to FIGS. 1 to 14 may be performed. Subsequently, a self-aligned layer may be formed on the intermediate layer 120.

In example embodiments, the self-aligned layer may sufficiently cover the guiding pillars 173 and the guiding dam 175, and may extend on the outer region of the guiding dam 175. Accordingly, the self-aligned layer may substantially cover the guiding pillars 173 and the guiding dam 175, and may be also formed on the intermediate layer 120 at the outer region. In some embodiments, the self-aligned layer may fully cover the guiding pillars 173 and the guiding dam 175.

As described with reference to FIGS. 15 and 16, first blocks 182a may be self-aligned or self-assembled in, e.g., a polygonal unit around the guiding pillar 173. Second blocks 184a may be arranged along a substantially straight line and along a sidewall of the guiding dam 175 at the inner region of the guiding dam 175.

In example embodiments, fourth blocks 184b may be arranged along a substantially straight line and along the sidewall of the guiding dam 175 at the outer region of the guiding dam 175. Accordingly, at least one fourth block column and/or fourth block row may be formed at the outer region of the guiding dam 175. The fourth blocks 184b may be formed in an arrangement substantially the same as or similar to that of the second blocks 184a, and may include a material such as PMMA substantially the same as or similar to that of the second blocks 184a.

A portion of the self-aligned layer except for the first blocks 182a, the second blocks 184a and the fourth blocks 184b may be defined as a third block 186a.

As illustrated in FIG. 26, the first to fourth blocks 182a, 184a, 186a and 184b may have a height greater than those of the guiding pillar 173 and/or the guiding dam 175.

Referring to FIGS. 27 and 28, a process substantially the same as or similar to that illustrated with reference to FIGS. 17 and 18 may be performed to remove the first blocks 182a, the second blocks 184a and the fourth blocks 184b.

First holes 192a, second holes 194a and fourth holes 194b may be formed at spaces from which the first blocks 182a, the second blocks 184a and the fourth blocks 184b may be removed, respectively.

The second holes 194a may be arranged substantially linearly to form a second hole column and/or a second hole row according to the arrangement of the second blocks 184a. The fourth holes 194b may be arranged substantially linearly to form a fourth hole column and/or a fourth hole row according to the arrangement of the fourth blocks 184a.

Referring to FIGS. 29 and 30, a trim pattern 196b covering the fourth hole column and/or the fourth hole row may be formed.

In some embodiments, a plurality of the fourth hole columns may be formed, and the trim pattern 196b may cover the plurality of the fourth hole columns. In this ease, the fourth holes 194b may be filled with the trim pattern 196b. For example, the fourth hole column adjacent to the sidewall of the guide dam 175 may serve as an align key or a reference pattern for forming the trim pattern 196b.

In some embodiments, the trim pattern 196b may cover the fourth hole columns, and may at least cover the guiding dam 175 as illustrated in FIGS. 19 and 20.

In some embodiments, the trim pattern 196b may cover the fourth hole rows and the guiding dam 175, and may at least cover the second hole column and/or the second hole row as illustrated in FIGS. 23 and 24.

Subsequently, processes substantially the same as or similar to those illustrated with reference to FIGS. 21 and 22 may be performed to form contact holes in the object layer 110. For example, the first holes 192a, the second holes 194a and third holes formed by removing, the pillars 172 may be transferred to form the contact holes.

Figure 31:
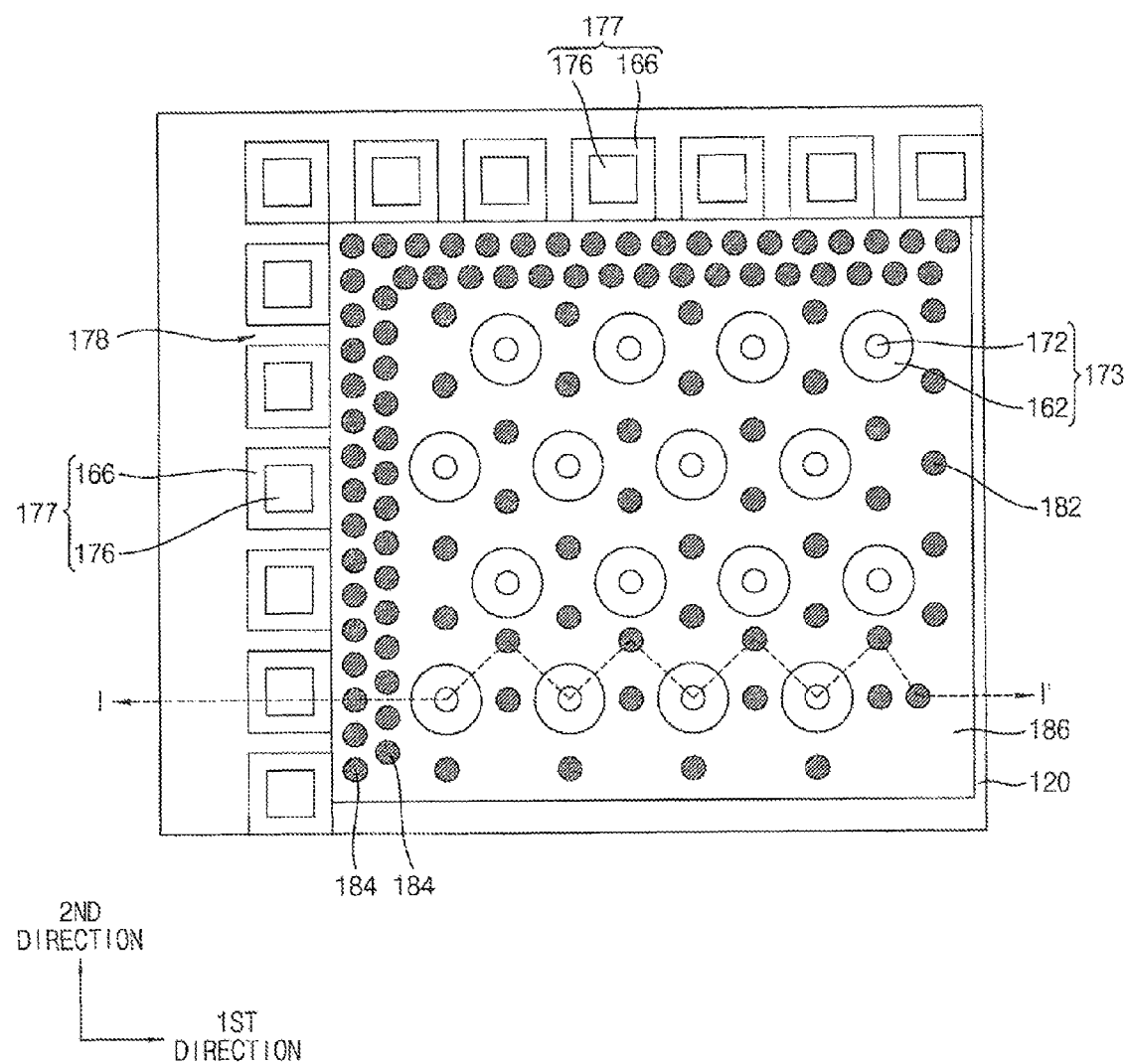
Figure 32:
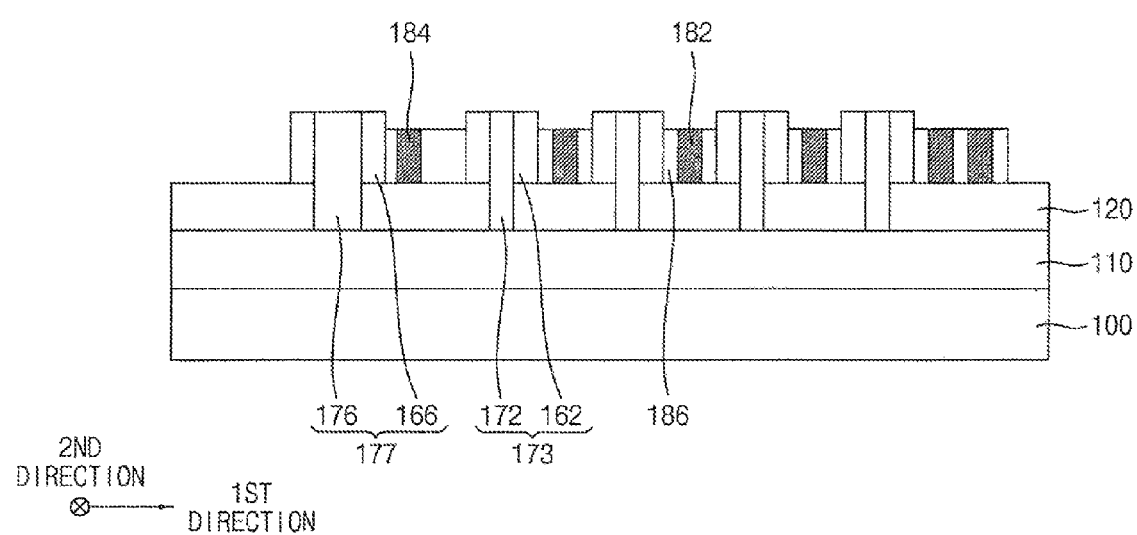
Figure 33:
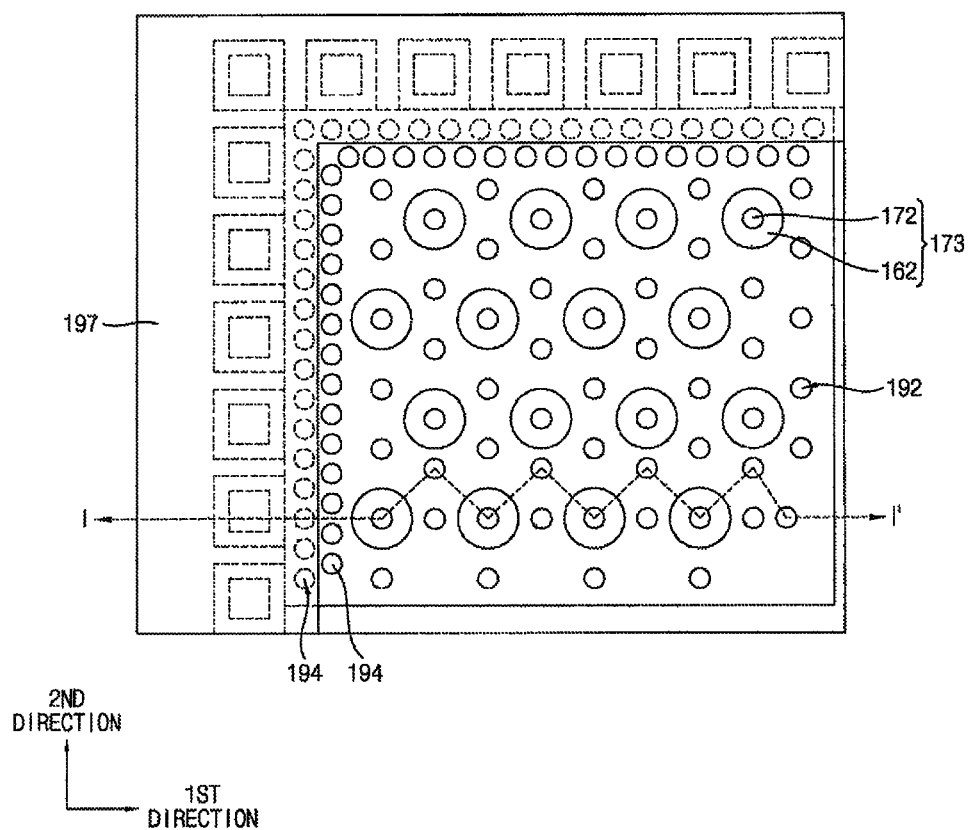
Figure 34:
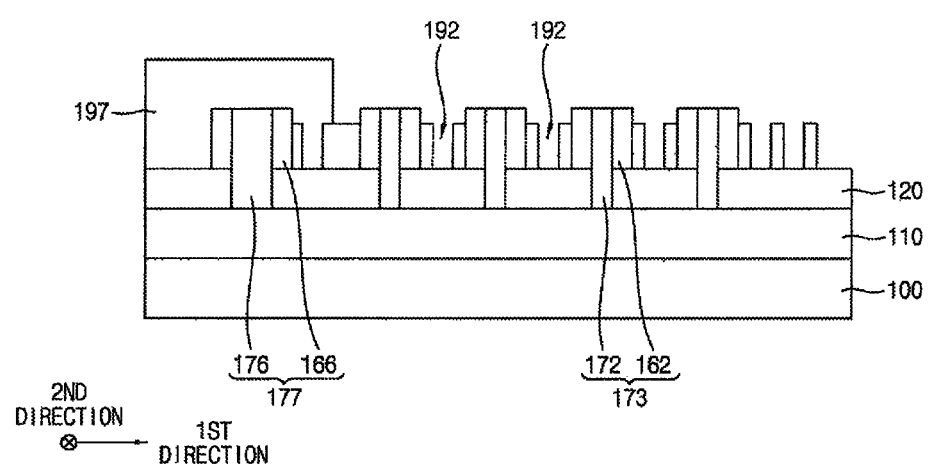

FIGS. 31 to 34 are top plan views and cross-sectional views illustrating a method of forming patterns of a semiconductor device in accordance with some example embodiments. Specifically, FIGS. 31 and 33 are top plan views illustrating the method. FIGS. 32 and 34 arc cross-sectional views taken along a line I-I' indicated in FIGS. 31 and 33.

Detailed descriptions on processes substantially the same as or similar to those illustrated with reference to FIGS. 1 to 22 are omitted herein.

Referring to FIGS. 31 and 32, processes substantially the same as or similar to those illustrated with reference to FIGS. 1 to 16 may be performed except for a formation of the guiding dam.

In example embodiments, a plurality of guiding patterns 177 may be formed along the first direction and/or the second direction to form a guiding pattern column and/or a guiding pattern row. The guiding pattern column and/or the guiding pattern row may substantially serve as the guiding dam.

Each guiding pattern 177 may include a sub-guide frame 166 and a sub-dam 176. A sidewall of the sub-dam 176 may be surrounded by the sub-guide frame 166.

For example, the preliminary opening 154 illustrated in FIG. 1 may be formed as a plurality of sub-preliminary openings separated from each other, and a plurality of the guiding patterns 177 may be formed by processes substantially the same as or similar to those illustrated with FIGS. 3 to 14.

As illustrated in FIG. 31, a slit 178 may be defined between the neighboring guiding patterns 177. A width of the slit 178 may be small sufficiently to block an entrance of a block copolymer or blocks while forming a self-aligned layer.

After forming the guiding patterns 177 and the guiding pillars 173, the self-aligned layer may be formed in an inner region of the guiding patterns 177 as described with reference to FIGS. 15 and 16 to form first blocks 182, second blocks 184 and a third block 186.

The slit 178 between the guiding patterns 177 may prevent a capillary phenomenon that may occur between a sidewall of the guiding dam 175 illustrated in FIG. 15 and the polymer units included in the self-aligned layer. Thus, an interference of a self-alignment of the blocks by the capillary phenomenon may be avoided. Therefore, the second blocks 184 may be uniformly arranged along a substantially straight line to be adjacent to the guiding patterns 177.

In some embodiments, as described with reference to FIGS. 25 and 26, the self-aligned layer may substantially entirely cover the guiding patterns 177, and may extend on an outer region of the guiding patterns 177. In this case, fourth blocks adjacent to the guiding patterns 177 at the outer region may be formed along a substantially straight line. In some embodiments, as described with reference to FIGS. 25 and 26, the self-aligned layer may entirely cover the guiding patterns 177, and may extend on an outer region of the guiding patterns 177.

Referring to FIGS. 33 and 34, processes substantially the same as or similar to those illustrated with reference to FIGS. 17 to 20 may be performed.

In example embodiments, the first blocks 182 and the second blocks 184 may be removed to form first holes 192 and second holes 194, respectively. At least one second hole column and/or second hole row arranged linearly may be formed by the second holes 194.

A trim pattern 197 covering the guiding patterns 177 may be formed. As illustrated with reference to FIGS. 33 and 34, the trim pattern 197 may cover the guiding patterns 177, and may at least partially cover the second hole column and/or the second hole row. In an embodiment, a plurality of the second hole columns and/or the second hole rows may be formed, and the trim pattern 197 may cover at least one of the second hole columns and/or the second hole rows.

In some embodiments, the trim pattern 197 may partially cover the guiding patterns 177.

In some embodiments, if the fourth blocks are formed at the outer region of the guiding patterns 177, the trim pattern 197 may at least partially cover a fourth hole column formed by removing the fourth blocks.

Subsequently, processes substantially the same as or similar to those illustrated with reference to FIGS. 21 and 22 may be performed to contact holes in the object layer 110.

Figure 35:
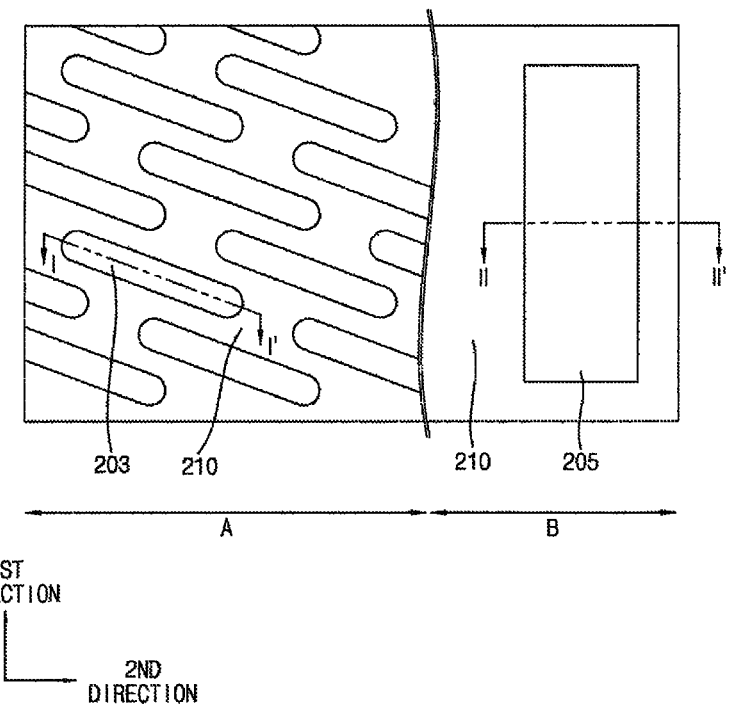

FIGS. 35 to 43 are a top plan view and cross-sectional views illustrating a method of manufacturing a semiconductor device in accordance with example embodiments, Specifically, FIG. 35 is a top plan view illustrating the method. FIGS. 36 to 43 include cross-sectional views taken along lines I-I' and II-II' indicated in a first region A and a second region B, respectively, of FIG. 35.

For example, FIGS. 35 to 43 illustrate a method of manufacturing a dynamic random access memory (DRAM) device, Detailed descriptions on processes and/or materials substantially the same as or similar to those illustrated with reference to FIGS. 1 to 22, FIGS. 23 and 24, FIGS. 25 to 30, or FIGS. 31 to 34 are omitted herein.

Figure 36:
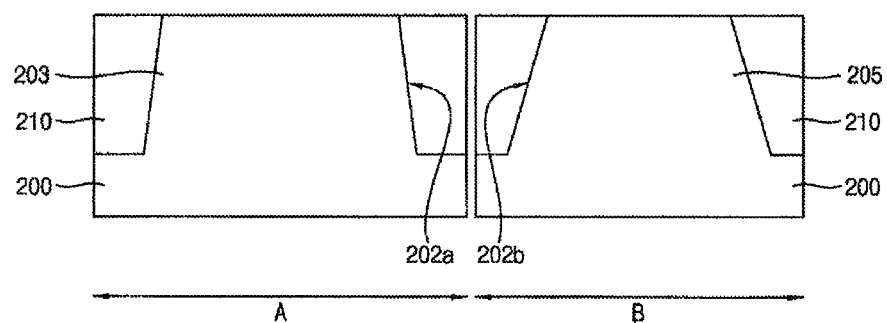

Referring to FIGS. 35 and 36, an isolation layer 210 and active patterns 203 and 205 may be formed at an upper portion of a substrate 200.

The substrate 200 may be divided into the first region A and the second region B, and the first region A and the second region B may be allotted as, e.g., a device region (or a cell region) and a peripheral circuit region, respectively.

In example embodiments, the isolation layer 210, and the active patterns 203 and 205 may be formed by a shallow trench isolation (STI) process. For example, a first mask pattern (not illustrated) and a second mask pattern (not illustrated) may be formed an portions of the substrate 200 at the first region A and the second region B, respectively. An upper portion of the substrate 200 may be partially removed using the first and second mask patterns as etching masks to form a first isolation trench 202a and a second isolation trench 202b at the first region A and the second region B, respectively.

After forming the first and second isolation trenches 202a and 202b, a first active pattern 203 and a second active pattern 205 protruding from a lower portion of the substrate 200 may be defined at the first region A and the second region B, respectively.

The first active pattern 203 may extend diagonally to a first direction and a second direction which may be parallel to a top surface of the substrate 200 and may be perpendicular to each other. A plurality of the first active patterns 203 may be arranged along the first and second directions at the first region A.

The second active pattern 205 may have, e.g., a plate shape extending in the first direction as illustrated in FIG. 35.

An insulation layer filling the isolation trenches 202a and 202b and including a silicon oxide-based material may be formed on the substrate 200. The insulation layer may be planarized by a CMP process until top surfaces of the active patterns 203 and 205 may be substantially exposed to form the isolation layer 210.

In some embodiments, a liner layer including, e.g., silicon oxide and/or silicon nitride may be formed along surfaces of the active patterns 203 and 205 before forming the isolation layer 210.

Figure 37:
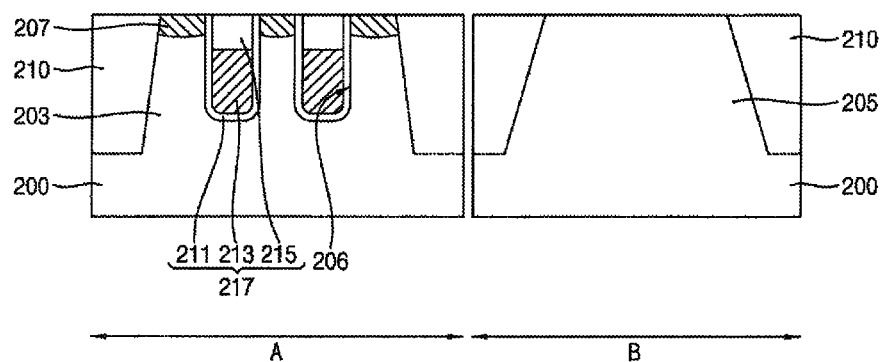

Referring to FIG. 37, a transistor including a first gate structure 217 and a first impurity region 207 may be formed on the substrate 200 at the first region A.

In example embodiments, a gate trench 206 extending through an upper portion of the first active pattern 203 may be formed. For example, the gate trench 206 may extend in the first direction indicated in FIG. 35, and may extend through upper portions of the first active patterns 203 and the isolation layer 210. A plurality of the gate trenches 206 may be formed along the second direction at the first region A. In some embodiments, as illustrated in FIG. 37, two gate trenches 206 may be formed at each first active pattern 203.

For example, a thermal oxidation process may be performed on surfaces of the first active patterns 203 exposed by the gate trench 206 to form a first gate insulation layer. Alternatively, silicon oxide or a metal oxide may be deposited by, e.g., a CVD process on the surfaces of the first active patterns 203 to form the first gate insulation layer.

A first gate conductive layer filling the gate trenches 206 may be formed on the first gate insulation layer. The first gate conductive layer and the first gate insulation layer may be planarized by a CMP process until the top surface of the first active pattern 203 may be exposed, and an upper portion of the first gate conductive layer formed in the gate trench 206 may be partially removed by an etch-back process. Accordingly, a first gate insulation pattern 211 may be formed in an inner wall of the gate trench 206, and a first gate electrode 213 filling a lower portion of the gate trench 206 may be formed on the first gate insulation pattern 211.

The first gate conductive layer may be formed of, e.g., a metal and/or a metal nitride by an ALD process or a sputtering process.

A first gate mask layer filling a remaining portion of the gate trench 206 may be formed on the first gate insulation pattern 211 and the first gate electrode 213. An upper portion of the first gate mask layer may be planarized until the top surface of the first gate active pattern 203 may be exposed to form a first gate mask 215. The first gate mask layer may be formed of, e.g., silicon nitride by a CVD process.

Accordingly, the first gate structure 217 including the first gate insulation pattern 211, the first gate electrode 213 and the first gate mask 215 sequentially stacked in the gate trench 206 may be formed.

According to the arrangement of the gate trenches 206 as described above, the first gate structure 217 may extend in the first direction, and a plurality of the gate structures 217 may be formed along the second direction.

An ion-implantation process may be performed to form a first impurity region 207 at an upper portion of the first active pattern 203 adjacent to the first gate structure 217. Accordingly, e.g., a buried cell array transistor (BCAT) structure including the first gate structure 217 and the first impurity region 207 may be formed at the first region A of the substrate 300.

Figure 38:
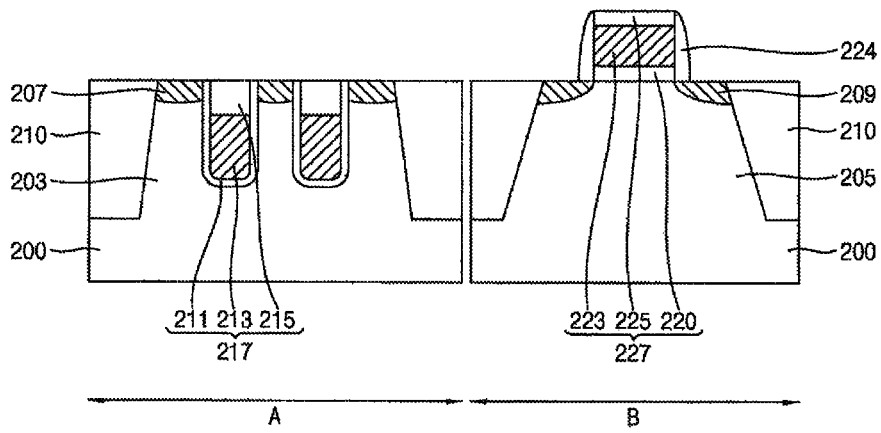

Referring to FIG. 38, a second gate structure 227 may be formed on the second active pattern 205.

In example embodiments, a second gate insulation layer, a second gate conductive layer and a second gate mask layer may be sequentially formed on the substrate 200, and may be patterned by a photo-lithography process to form the second gate structure 227 including a second gate insulation pattern 220, a second gate electrode 223 and a second gate mask 225.

Impurities may be implanted at an upper portion of the second active pattern 205 using the second gate structure 227 as an ion-implantation mask to form a second impurity region 209. Accordingly, a peripheral circuit transistor including the second gate structure 227 and the second impurity region 209 may be formed at the second region B.

A gate spacer 224 may be further formed on a sidewall of the second gate structure 227. For example, a spacer layer including silicon nitride and covering the second gate structure 227 may be formed, and then may be anisotropically etched to form the gate spacer 224.

Figure 39:
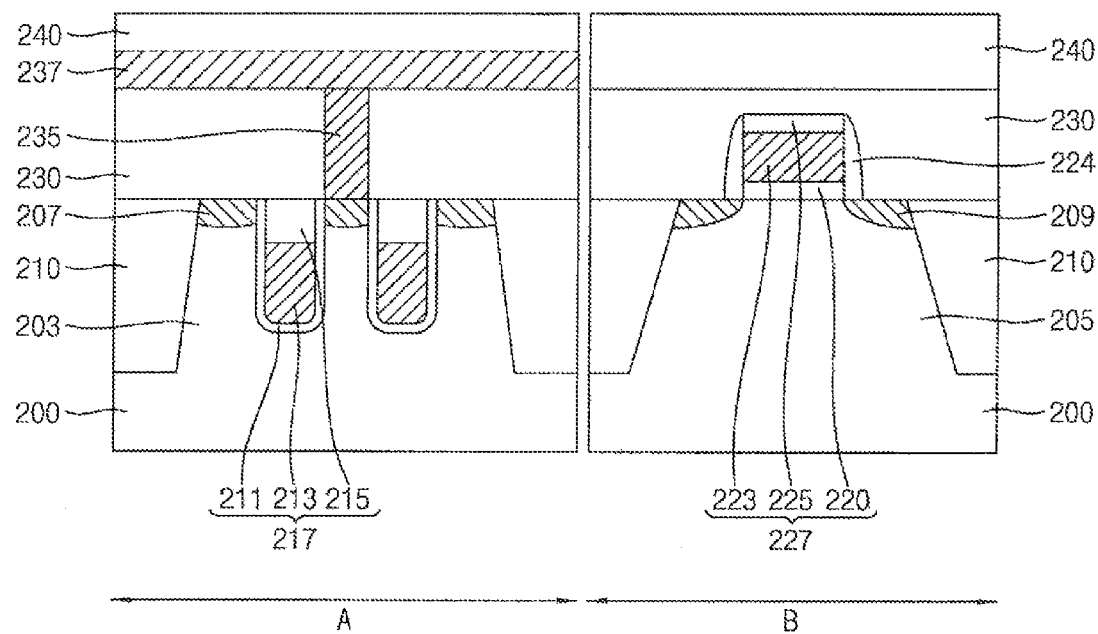

Referring to FIG. 39, a first insulating interlayer 230 covering the first and second gate structures 217 and 227 may be formed on the first and second active patterns 203 and 205, and the isolation layer 210. The first insulating interlayer 230 may be formed of a silicon oxide-based material such as PEOX, TEOS, FOX, or the like by a CVD process.

A first contact 235 electrically connected to the first impurity region 207 may be formed through the first insulating interlayer 230. For example, the first contact 235 may be electrically connected to a central portion of the first impurity region 207 formed between the first gate structures 217. A conductive line 237 electrically connected to the first contact 235 may be formed on the first insulating interlayer 230.

The conductive line 237 may extend in the second direction indicated in FIG. 35 at the first region A, and may be electrically connected to a plurality of the first contacts 235. A plurality of the conductive lines 237 may be formed along the first direction. In some embodiments, the first contact 235 and the conductive line 237 may be integral with each other, and may be provided as a single or unitary member.

In some embodiments, the first contact 235 and the conductive line 237 may serve as a bit line contact and a bit line, respectively.

A second insulating interlayer 240 covering the conductive line 237 may be formed on the first insulating interlayer 230.

The second insulating interlayer 240 may be formed of a silicon oxide-based material substantially the same as or similar to that of the first insulating interlayer 230. The first contact 235 and the conductive line 237 may be formed of a metal, a metal nitride, a metal silicide or a doped polysilicon.

Figure 40:
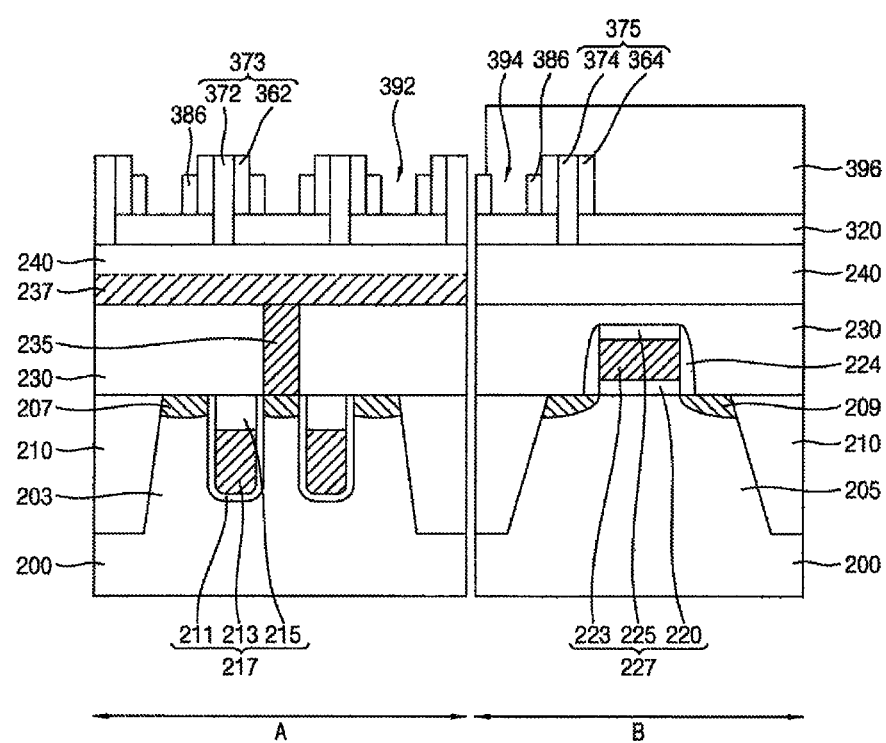

Referring to FIG. 40, processes substantially the same as or similar to those illustrated with reference to FIGS. 1 to 20 may be performed on the second insulating interlayer 240.

In example embodiments, an intermediate layer 320 may be formed on the second insulating interlayer 240, and guiding pillars 373 and a guiding dam 375 may be formed on the intermediate layer 320.

Each guiding pillar 373 may include a guide ring 362 and a pillar 372 formed in the guide ring 362. The guiding dam 375 may include a guide frame 364 and a dam 374 formed in the guide frame 364.

The guiding dam 375 may extend in, e.g., the first direction indicated in FIG. 35. In some embodiments, the guiding dam 375 may extend in the first and second directions, and may have a fence shape surrounding the guiding pillars 373. In some embodiments, the guiding dam 375 may have a structure including a plurality of guiding patterns arranged linearly as illustrated in FIG. 31.

In example embodiments, the guiding pillars 373 may be formed on a portion of the intermediate layer 320 at the first region A. The guiding dam 375 may be formed on a portion of the intermediate layer 320 at the second region B.

A self-aligned layer including a block copolymer may be formed in a space between the guiding pillars 373 and the guiding dam 375 to form first blocks, second blocks and a third block. The first and second blocks may be removed to form first holes 392 and second holes 394. The second holes 394 may be arranged substantially linearly along a sidewall of the guiding dam 375 to form at least one second hole column.

In some embodiments, the second hole column may be also formed at an outer region of the guiding dam 375 as described with reference to FIG. 27.

In example embodiments, the first holes 392 may be substantially superimposed over both peripheral portions of the first active pattern 203.

A trim pattern 396 covering the guiding dam 375 may be formed on the portion of the intermediate layer 320 at the second region 13.

The trim pattern 396 may fully cover the guiding dam 375, and may at least partially cover the second hole column. In some embodiments, the trim pattern 396 may partially cover the guiding dam 375 as illustrated in FIG. 19.

Figure 41:
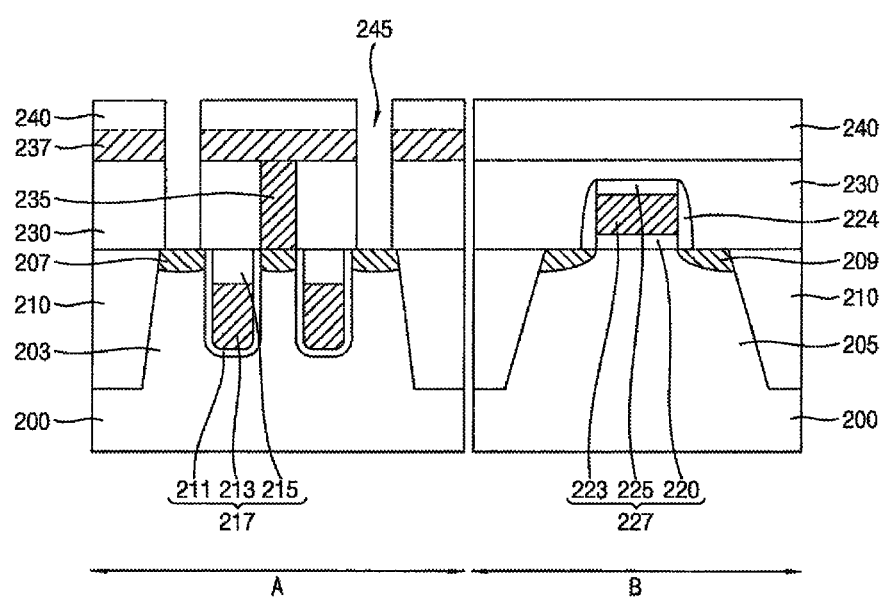

Referring to FIG. 41, processes substantially the same as or similar to those illustrated with reference to FIGS. 21 and 22 may be performed to form first contact holes 245.

In example embodiments, the first contact holes 245 may be formed by transferring the first holes 392 into the first and second insulating interlayers 230 and 240. Additionally, the first contact holes 245 may include holes formed by removing and transferring the pillars 372. The first impurity region 207 formed at the peripheral portions of the first active pattern 203 may be exposed through the first contact holes 245.

Figure 42:
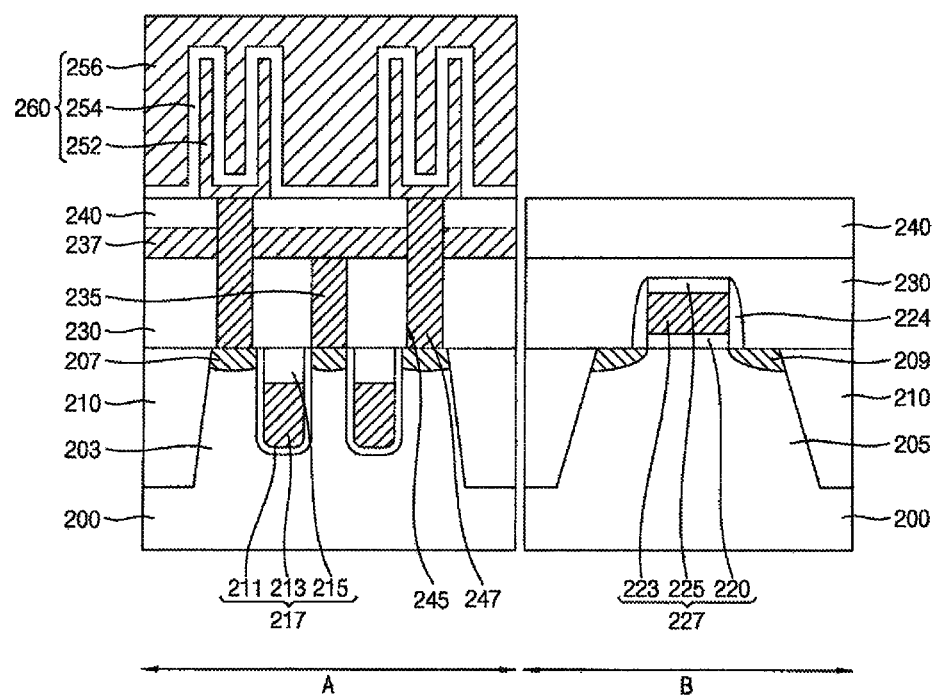

Referring to FIG. 42, a second contact 247 electrically connected to the first impurity region 207 may be formed in the first contact hole 245. The second contact 247 may serve as, e.g., a capacitor contact. The second contact 247 may be formed of a metal, a metal nitride, a metal silicide and doped polysilicon, and may be formed by a plating process or a deposition process such as a CVD process, an ALD process, a sputtering process, etc.

In example embodiments, a capacitor 260 may be formed on the second contact 247.

For example, an etch-stop layer (not illustrated) may be formed on the second insulating interlayer 240 and the second contact 247 at the first region A, and a mold layer (not illustrated) may be formed on the etch-stop layer. The mold layer and the etch-stop layer may be partially removed to form an opening through which a top surface of the second contact 247 may be exposed.

A lower electrode layer may be formed along an inner wall of the opening and a top surface of the mold layer. A sacrificial layer (not illustrated) may be formed on the lower electrode layer, and upper portions of the sacrificial layer and the lower electrode layer may be planarized such that the top surface of the mold layer may be exposed. The sacrificial layer and the mold layer may be removed to form a lower electrode 252. The sacrificial layer and the mold layer may be formed of silicon oxide, and may be removed using an etchant solution that may include fluoric acid.

A dielectric layer 254 may be formed on surfaces of the etch-stop layer and the lower electrode 252, and an upper electrode layer may be formed on the dielectric layer 254. Portions of the dielectric layer 254 and the upper electrode layer formed at the second region B may be removed to form an upper electrode 256 at the first region A.

The lower and upper electrode layers may be formed of a metal and/or a metal nitride by a sputtering process, an ALD process, a PVD process, or the like. The dielectric layer 254 may be formed of a metal oxide having a high dielectric constant (high-k), hathium oxide (HFOx), zirconium oxide (ZrOx) or aluminum oxide (AlOx) by a CVD process or an ALD process.

Accordingly, the capacitor 60 including the lower electrode 252, the dielectric layer 254 and the upper electrode 256 may be formed at the first region A.

Figure 43:
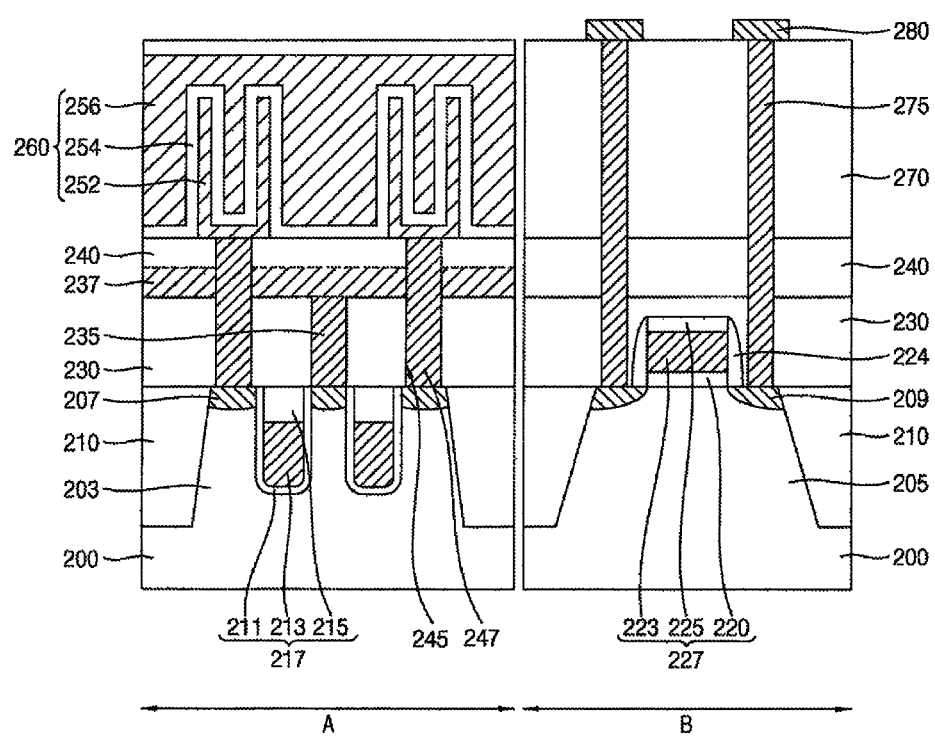

Referring to FIG. 43, a third insulating interlayer 270 covering the capacitor 260 may be formed on the second insulating interlayer 240. The third insulating interlayer 270 may be formed throughout the first region A and the second region B. Additionally, an upper surface of the third insulating interlayer 270 may be planarized by a CMP process.

A third contact 275 and a wiring 280 electrically connected to the peripheral circuit transistor may be formed at the second region B of the substrate 200. For example, a contact hole exposing the second impurity region 209 may be formed through the third insulating interlayer 270, the second insulating interlayer 240 and the first insulating interlayer 230. A conductive layer filling the contact hole may be formed on the third insulating interlayer 270, and an upper portion of the conductive layer may be planarized to form the third contact 275 electrically connected to the second impurity region 209. The wiring 280 electrically connected to the third contact 275 may be formed on the third insulating interlayer 270. The third contact 275 and the wiring 280 may serve as a portion of peripheral circuits.

In some embodiments, a passivation layer including silicon nitride may be further formed on the capacitor 260.

As described above, the second hole column may serve as an align key or a reference pattern fin forming the trim pattern on the peripheral circuit region. Therefore, an align margin for forming the first contact holes 245 at the device region or the cell region may be achieved, and a misalignment may be avoided.

According to example embodiments of the present inventive concepts, a guiding dam may be formed at a peripheral portion of a substrate together with guiding pillars, and a self-aligned layer may be formed on the guiding pillars and the guiding dam using a block copolymer. Polymer units included in the block copolymer may form first pillars radially expanded in a polygonal arrangement around the guiding pillar, and second pillars which may be arranged substantially linearly near the guiding dam. The second pillars may be arranged linearly, and thus a trim line may be easily set or determined. Further, a trim margin may be additionally obtained from the guiding dam.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming patterns of a semiconductor device, comprising:
   sequentially forming an object layer and an intermediate layer on a substrate;
   forming a plurality of guiding pillars and at least one guiding bar on the intermediate layer, the at least one guiding bar extending in a first direction and having first and second sides opposite to each other in a second direction substantially perpendicular to the first direction;

forming a self-aligned layer including a block copolymer in a space between the guiding pillars and the guiding bar, such that first blocks aligned around the guiding pillars and second blocks aligned around the guiding bar are formed, the first blocks facing the first side of the guiding bar, and the second blocks being spaced apart from each other along the first direction between the first side of the guiding bar and the first blocks, wherein a portion of the self-aligned layer excluding the first and second blocks is defined as a third block;

removing the first and second blocks to form first and second holes, respectively, in the self-aligned layer that exposes the intermediate layer;

forming a mask at least partially covering an upper surface of the guiding bar using the second holes as a reference pattern for positioning the mask;

removing the intermediate layer using the mask, the guiding bar, and the third block as an etching mask to form third holes exposing the object layer; and transferring a shape of the first blocks in the object layer by removing the object layer exposed by the third holes.

2. The method of claim 1, wherein forming the self-aligned layer includes forming the first blocks aligned in a grid arrangement and the second blocks arranged linearly along a sidewall of the guiding bar.

3. The method of claim 2, further comprising removing the first blocks to form first holes and removing the second blocks to form second holes,
wherein at least one second hole column arranged in a straight line is formed by the second holes.

4. The method of claim 3, wherein the mask at least partially covers the second hole column.

5. The method of claim 3, wherein forming the mask includes using the second hole column as a mask.

6. The method of claim 3, wherein transferring the shape of the first blocks in the object layer includes etching the object layer through the first holes to form first contact holes.

7. The method of claim 1, wherein an inner region in which the guiding pillars are included is defined by the guiding bar, and the self-aligned layer is also formed at an outer region of the guiding bar.

8. The method of claim 1, wherein the first blocks, and the second blocks include polymethylmethacrylate (PMMA), and the third block includes polystyrene (PS).

9. The method of claim 1, wherein the guiding bar includes a plurality of guiding patterns arranged along a straight line, and
an opening is formed between proximally located ones of the plurality of the guiding patterns.

10. The method of claim 9, wherein the opening has a width capable of blocking an entrance of the block copolymer included in the self-aligned layer.

11. A method of forming patterns of a semiconductor device, comprising:
sequentially forming an object layer and an intermediate layer on a substrate;
forming a block copolymer layer including first blocks, second blocks and a third block on the intermediate layer, the first blocks being aligned in a grid arrangement, the second blocks being arranged in a straight line, and the third block being a portion of the block copolymer layer excluding the first and second blocks;
removing the first and second blocks to form first and second holes, respectively, in the block copolymer layer that expose the intermediate layer;
forming a mask on the intermediate layer using the second holes as a reference pattern for positioning the mask;
removing the intermediate layer using the mask and the third block as an etching mask to form third holes exposing the object layer; and
transferring a shape of the first blocks in the object layer by removing the object layer exposed by the third holes.

12. The method of claim 11, wherein forming the first blocks and the second blocks includes:
forming a plurality of guiding pillars and at least one guiding dam bar on the object layer; and
coating the block copolymer in a space between the guiding pillars and the guiding bar to form the first blocks aligned around the guiding pillars and the second blocks aligned around the guiding bar.

13. The method of claim 12, wherein forming the guiding pillars and the guiding bar includes:
forming guide rings and a guide frame on the object layer; and
forming pillars and a bar in the guide rings and the guide frame, respectively.

* * * * *